US012712047B2

(12) United States Patent
Ayyapureddi et al.

(10) Patent No.: US 12,712,047 B2
(45) Date of Patent: Aug. 18, 2026

(54) APPARATUSES AND METHODS FOR SEPARATE WRITE ENABLE FOR SINGLE-PASS ACCESS OF DATA, METADATA, AND PARITY INFORMATION

(71) Applicant: Micron Technology, Inc., Boise, ID (US)

(72) Inventors: Sujeet Ayyapureddi, Boise, ID (US); Scott E. Smith, Boise, ID (US)

(73) Assignee: Micron Technology, Inc., Boise, ID (US)

(*) Notice: Subject to any disclaimer, the term of this patent is extended or adjusted under 35 U.S.C. 154(b) by 187 days.

(21) Appl. No.: 18/504,353

(22) Filed: Nov. 8, 2023

(65) Prior Publication Data

US 2024/0161859 A1 May 16, 2024

Related U.S. Application Data

(60) Provisional application No. 63/383,738, filed on Nov. 15, 2022.

(51) Int. Cl.
*G11C 29/52* (2006.01)
*G11C 7/10* (2006.01)
(Continued)

(52) U.S. Cl.
CPC ............ *G11C 29/52* (2013.01); *G11C 7/1096* (2013.01); *G11C 7/12* (2013.01); *G11C 29/785* (2013.01)

(58) Field of Classification Search
CPC ...................................................... G11C 29/52
(Continued)

(56) References Cited

U.S. PATENT DOCUMENTS

| | | | |
|---|---|---|---|
| 5,177,705 | A | 1/1993 | Mcelroy et al. |
| 5,299,164 | A | 3/1994 | Takeuchi et al. |

(Continued)

FOREIGN PATENT DOCUMENTS

| | | | |
|---|---|---|---|
| WO | 2016048634 | A1 | 3/2016 |
| WO | 2024107367 | A1 | 5/2024 |

(Continued)

OTHER PUBLICATIONS

Lumenci Team "High Bandwidth Memory (HBM3)" https://lumenci.com/blogs/high-bandwidth-memory; Editorial Team at Lumenci, Jul. 14, 2022; pp. 1-3.*

(Continued)

*Primary Examiner* — Muna A Techane
(74) *Attorney, Agent, or Firm* — Dorsey & Whitney LLP

(57) ABSTRACT

Apparatuses, systems, and methods for separate write enable signals for data, metadata, and parity information. A memory array is divided into column planes and an extra column plane. In some modes of the memory device, data and parity information is stored in the column planes and metadata is stored in the extra column plane. The extra column plane includes separate write enable signals (or separate states of a single signal) which activate different portions of the bit lines (e.g., even and odd bit lines). In an example access operation, a column select signal is provided to the extra column plane along with one or the other write enable signals such that fewer than all of the bit lines activated by the column select signal provide data.

20 Claims, 10 Drawing Sheets

(51) Int. Cl.
*G11C 7/12* (2006.01)
*G11C 29/00* (2006.01)

(58) Field of Classification Search
USPC .................................................... 365/185.09
See application file for complete search history.

(56) References Cited

U.S. PATENT DOCUMENTS 5,434,814 A 7/1995 Cho et al.
6,249,476 B1 6/2001 Yamazaki et al.
7,117,421 B1 10/2006 Danilak
8,891,313 B2 11/2014 Chang et al.
9,158,617 B2 10/2015 Cho et al.
9,195,537 B2 11/2015 Sharon et al.
9,201,728 B2 12/2015 Patapoutian et al.
9,361,960 B2 6/2016 Vogelsang
9,547,550 B1 1/2017 Thakore et al.
9,607,679 B1 3/2017 Kim et al.
9,666,291 B2* 5/2017 Park ...................... G11C 16/16
9,880,901 B2 1/2018 Zastrow
9,996,799 B2 6/2018 Bostick et al.
10,127,101 B2 11/2018 Halbert et al.
10,222,989 B1 3/2019 Zitlaw
10,243,590 B1 3/2019 Seshadri
10,810,079 B2 10/2020 Halbert et al.
10,817,371 B2 10/2020 Rooney et al.
10,872,011 B2 12/2020 Bains et al.
10,929,033 B2 2/2021 Meeker et al.
10,937,517 B1 3/2021 Rich-Plotkin et al.
10,963,336 B2 3/2021 Veches
11,010,304 B2 5/2021 Kang et al.
11,074,126 B2 7/2021 Prather et al.
11,088,710 B2 8/2021 Lee et al.
11,177,012 B1 11/2021 Avraham et al.
11,200,961 B1 12/2021 Uribe
11,264,085 B1 3/2022 Ware et al.
11,538,515 B2 12/2022 Ji et al.
11,579,971 B2 2/2023 Ayyapureddi
11,580,038 B2 2/2023 Norman et al.
11,615,861 B2 3/2023 Kim et al.
11,830,570 B2 11/2023 Laurent et al.
11,837,316 B1 12/2023 Smith et al.
12,001,707 B2 6/2024 Boehm et al.
12,014,797 B2 6/2024 Ayyapureddi
12,019,513 B2 6/2024 Ayyapureddi
12,095,474 B1 9/2024 Zhu et al.
12,204,410 B2 1/2025 Sutera et al.
12,204,770 B2 1/2025 Ayyapureddi
12,230,347 B2 2/2025 Suh et al.
12,249,393 B2 3/2025 Reohr
12,299,291 B2 5/2025 Eilert et al.
12,475,965 B2 11/2025 Smith et al.
12,488,853 B2 12/2025 Smith et al.
12,511,191 B2 12/2025 Ayyapureddi et al.
12,512,176 B2 12/2025 Smith et al.
12,524,298 B2 1/2026 Ayyapureddi
12,524,306 B2 1/2026 Ayyapureddi
12,530,261 B2 1/2026 Ayyapureddi et al.
12,536,096 B2 1/2026 Ayyapureddi
12,541,425 B2 2/2026 Ayyapureddi et al.
12,541,429 B2 2/2026 Ayyapureddi
2003/0081492 A1 5/2003 Farrell et al.
2003/0117838 A1 6/2003 Hidaka
2005/0226070 A1 10/2005 Ohsawa
2006/0233030 A1 10/2006 Choi
2008/0089129 A1 4/2008 Lee
2008/0313493 A1* 12/2008 Roohparvar ........ G06F 11/1072
714/E11.03
2009/0097348 A1 4/2009 Minzoni et al.
2009/0132876 A1 5/2009 Freking et al.
2009/0168523 A1 7/2009 Shirakawa et al.
2009/0196103 A1 8/2009 Kim et al.
2010/0177582 A1 7/2010 Kim et al.
2010/0177587 A1 7/2010 Huang
2010/0290146 A1 11/2010 Lam
2011/0154158 A1 6/2011 Yurzola et al.
2012/0092940 A1 4/2012 Chang et al.
2013/0117630 A1 5/2013 Kang
2013/0275709 A1 10/2013 Gajapathy
2014/0126300 A1 5/2014 Takahashi et al.
2015/0193464 A1 7/2015 Kwon et al.
2015/0262631 A1 9/2015 Shimizu
2016/0070507 A1 3/2016 Hoshikawa et al.
2016/0092307 A1* 3/2016 Bonen ................ G06F 11/1004
714/764
2016/0125920 A1 5/2016 Kim et al.
2016/0307645 A1 10/2016 Kim et al.
2016/0365131 A1 12/2016 Kim et al.
2017/0060681 A1 3/2017 Halbert et al.
2017/0062067 A1 3/2017 Yang et al.
2017/0091025 A1 3/2017 Ahn et al.
2017/0192843 A1 7/2017 Warnes et al.
2017/0249097 A1 8/2017 Eguchi
2017/0269992 A1 9/2017 Bandic et al.
2017/0285990 A1 10/2017 Chen et al.
2017/0286213 A1 10/2017 Li
2017/0344423 A1 11/2017 Hsiao et al.
2018/0025760 A1 1/2018 Mazumder et al.
2018/0121283 A1 5/2018 Plants
2018/0150350 A1 5/2018 Cha et al.
2018/0301203 A1 10/2018 Kim
2019/0066816 A1 2/2019 Dono
2019/0073261 A1 3/2019 Halbert et al.
2019/0103154 A1 4/2019 Cox et al.
2019/0197171 A1 6/2019 Tiwari et al.
2019/0206478 A1 7/2019 Jun
2019/0362792 A1 11/2019 Oh et al.
2019/0369893 A1 12/2019 Ross
2019/0371403 A1 12/2019 Maejima
2020/0019462 A1 1/2020 Prather et al.
2020/0051616 A1 2/2020 Cho
2020/0104205 A1 4/2020 Noguchi et al.
2020/0104208 A1 4/2020 Heo et al.
2020/0194050 A1 6/2020 Akamatsu
2020/0226039 A1 7/2020 Lee
2020/0321060 A1 10/2020 Lang et al.
2020/0373941 A1 11/2020 Latorre et al.
2021/0011645 A1 1/2021 Martinelli et al.
2021/0012817 A1 1/2021 Laurent et al.
2021/0012849 A1 1/2021 Kim et al.
2021/0057003 A1 2/2021 Prather et al.
2021/0064119 A1 3/2021 Mirichigni et al.
2021/0064282 A1 3/2021 He et al.
2021/0064461 A1 3/2021 Veches
2021/0064467 A1 3/2021 Buerkle et al.
2021/0083687 A1 3/2021 Lee et al.
2021/0142848 A1 5/2021 Lim et al.
2021/0142860 A1 5/2021 Song et al.
2021/0200630 A1 7/2021 Ishikawa et al.
2021/0208967 A1 7/2021 Cha et al.
2021/0224155 A1 7/2021 Bains et al.
2021/0247910 A1 8/2021 Kim et al.
2021/0272627 A1 9/2021 Lee
2021/0294692 A1 9/2021 Chen
2021/0311821 A1 10/2021 Ryu et al.
2021/0311822 A1 10/2021 Jannusch et al.
2021/0311830 A1 10/2021 Lee
2021/0357287 A1 11/2021 Kim et al.
2021/0358559 A1* 11/2021 Suh ..................... G06F 11/1048
2021/0365316 A1 11/2021 Nale et al.
2021/0406123 A1 12/2021 Nakanishi et al.
2022/0027090 A1 1/2022 Kwon et al.
2022/0035529 A1 2/2022 Bennett
2022/0084565 A1 3/2022 Prather et al.
2022/0091938 A1 3/2022 Buerkle et al.
2022/0129196 A1 4/2022 Roberts et al.
2022/0138065 A1 5/2022 Secatch et al.
2022/0197739 A1 6/2022 Ryu et al.
2022/0261310 A1 8/2022 Ishikawa et al.
2022/0334917 A1 10/2022 Veches
2022/0337271 A1 10/2022 Hanna
2022/0365692 A1 11/2022 Vankamamidi et al.
2022/0398042 A1 12/2022 Song et al.
2022/0415398 A1 12/2022 Lien et al.

(56) References Cited

U.S. PATENT DOCUMENTS

| | | | |
|---|---|---|---|
| 2023/0009642 | A1 | 1/2023 | Eilert et al. |
| 2023/0146549 | A1 | 5/2023 | Lien et al. |
| 2023/0161665 | A1 | 5/2023 | Choi et al. |
| 2023/0185665 | A1 | 6/2023 | Ayyapureddi |
| 2023/0223096 | A1 | 7/2023 | Bains et al. |
| 2023/0236747 | A1 | 7/2023 | Curewitz et al. |
| 2023/0289072 | A1 | 9/2023 | Cho et al. |
| 2023/0298682 | A1 | 9/2023 | Suh et al. |
| 2023/0315571 | A1 | 10/2023 | Sutera et al. |
| 2023/0350581 | A1 | 11/2023 | Ayyapureddi |
| 2023/0350748 | A1 | 11/2023 | Ayyapureddi |
| 2023/0352064 | A1 | 11/2023 | Ayyapureddi |
| 2023/0352112 | A1 | 11/2023 | Ayyapureddi |
| 2024/0004754 | A1 | 1/2024 | Veches |
| 2024/0029781 | A1 | 1/2024 | Schreck et al. |
| 2024/0079074 | A1 | 3/2024 | Bak et al. |
| 2024/0086520 | A1 | 3/2024 | Kaplan et al. |
| 2024/0096404 | A1 | 3/2024 | Cho et al. |
| 2024/0126438 | A1 | 4/2024 | Suh et al. |
| 2024/0160351 | A1 | 5/2024 | Ayyapureddi et al. |
| 2024/0160524 | A1 | 5/2024 | Ayyapureddi et al. |
| 2024/0160527 | A1 | 5/2024 | Ayyapureddi et al. |
| 2024/0161855 | A1 | 5/2024 | Smith et al. |
| 2024/0161856 | A1 | 5/2024 | Smith et al. |
| 2024/0170088 | A1 | 5/2024 | Smith et al. |
| 2024/0176699 | A1 | 5/2024 | Ayyapureddi et al. |
| 2024/0177794 | A1 | 5/2024 | Vogelsang |
| 2024/0220142 | A1 | 7/2024 | Park |
| 2024/0220149 | A1 | 7/2024 | Kim et al. |
| 2024/0248796 | A1 | 7/2024 | Ayyapureddi |
| 2024/0256380 | A1 | 8/2024 | Ayyapureddi |
| 2024/0256382 | A1 | 8/2024 | Ayyapureddi |
| 2024/0272979 | A1 | 8/2024 | Ayyapureddi |
| 2024/0272984 | A1 | 8/2024 | Ayyapureddi |
| 2024/0273014 | A1 | 8/2024 | Ayyapureddi |
| 2024/0274223 | A1 | 8/2024 | Ayyapureddi |
| 2024/0281327 | A1 | 8/2024 | Ayyapureddi et al. |
| 2024/0289266 | A1 | 8/2024 | Ayyapureddi |
| 2024/0321328 | A1 | 9/2024 | Ayyapureddi |
| 2024/0377952 | A1 | 11/2024 | Song et al. |
| 2024/0394178 | A1 | 11/2024 | Partsch |
| 2024/0419538 | A1 | 12/2024 | Huang et al. |
| 2025/0077103 | A1 | 3/2025 | Ayyapureddi |
| 2025/0077424 | A1 | 3/2025 | Ayyapureddi |
| 2025/0078906 | A1 | 3/2025 | Kim et al. |
| 2025/0078949 | A1 | 3/2025 | Ayyapureddi |
| 2025/0078950 | A1 | 3/2025 | Ayyapureddi |
| 2025/0110643 | A1 | 4/2025 | Ayyapureddi |
| 2025/0110825 | A1 | 4/2025 | Ayyapureddi |
| 2025/0110830 | A1 | 4/2025 | Ayyapureddi |
| 2025/0111887 | A1 | 4/2025 | Ayyapureddi |
| 2025/0112643 | A1 | 4/2025 | Ayyapureddi |
| 2025/0123924 | A1 | 4/2025 | Ayyapureddi et al. |
| 2025/0138940 | A1 | 5/2025 | Cho et al. |
| 2025/0156087 | A1 | 5/2025 | Ayyapureddi |
| 2025/0165160 | A1 | 5/2025 | Eilert et al. |

FOREIGN PATENT DOCUMENTS

| | | | |
|---|---|---|---|
| WO | 2024107503 | A1 | 5/2024 |
| WO | 2024107504 | A1 | 5/2024 |
| WO | 2024167711 | A1 | 8/2024 |
| WO | 2025053912 | A1 | 3/2025 |
| WO | 2025075696 | A1 | 4/2025 |
| WO | 2025075697 | A1 | 4/2025 |

OTHER PUBLICATIONS

Chen et al., "CATCAM: Constant-time Alteration Ternary CAM with Scalable In-Memory Architecture"; 2020 53rd Annual IEEE/ACM International Symposium on Microarchitecture (MICRO), Athens, Green; Oct. 17-21, 2020; pp. 342-355.*

J. F. Philippe Marchand "An Alterable Programmable Logic Array"; IEEE Journal of Solid-State Circuits, vol. sc-20, No. 5, Oct. 1985; pp. 1061-1066.*

Handy, Jim, "Emerging Memories Today: Understanding Bit Selectors", The Memory Guy Blog, Objective Analysis on Semiconductor Memories, Nov. 2018, 5 pgs.*

PCT Application No. PCT/US23/76430 titled "Apparatuses and Methods for Separate Write Enable for Single-Pass Access of Data, Metadata, and Parity Information" filed Oct. 10, 2023, pp. all pages of application as filed.

PCT Application No. PCT/US23/76433 titled "Apparatuses and Methods for Single-Pass Access of Ecc Information, Metadata Information or Combinations Thereof" filed Oct. 10, 2023; pp. all pages of application as filed.

PCT Application No. PCT/US24/13516, titled "Apparatuses, Systems, and Methods for Storing Memory Metadata" filed Jan. 30, 2024; pp. all pages of application as filed.

U.S. Appl. No. 17/730,381, titled "Apparatuses, Systems, and Methods for Per Row Error Scrub Information", filed Apr. 27, 2022; pp. all pages of application as filed.

U.S. Appl. No. 17/731,024, titled "Apparatuses, Systems, and Methods for Managing Metadata Storage At a Memory", filed Apr. 27, 2022; pp. all pages of the application as filed.

U.S. Appl. No. 18/424,282 titled "Apparatuses and Methods for Bounded Fault Compliant Metadata Storage" filed Jan. 26, 2024; pp. all pages of application as filed.

U.S. Appl. No. 18/424,342 titled "Apparatuses and Methods for Bounded Fault Compliant Metadata Storage" filed Jan. 26, 2024; pp. all pages of application as filed.

U.S. Appl. No. 18/430, 381, titled "Apparatuses, Systems, and Methods for Storing Memory Metadata", filed Feb. 1, 2024; pp. all pages of application as filed.

U.S. Appl. No. 18/430,406, titled "Apparatuses, Systems, and Methods for Storing Memory Metadata", filed Feb. 1, 2024; pp. all pages of application as filed.

U.S. Appl. No. 18/431,232, titled "Apparatuses, Systems, and Methods for Storing Memory Metadata", filed Feb. 2, 2024; pp. all pages of application as filed.

U.S. Appl. No. 18/431,306, titled "Apparatuses, Systems, and Methods for Storing Memory Metadata", filed Feb. 2, 2024; pp. all pages of application as filed.

U.S. Appl. No. 18/504,215 titled "Apparatuses and Methods for Enhanced Metadata Support" filed Nov. 8, 2023; pp. all pages of application as filed.

U.S. Appl. No. 18/504,234 titled "Apparatuses and Methods for Enhanced Metadata Support" filed Nov. 8, 2023; pp. all pages of application as filed.

U.S. Appl. No. 18/504,316 titled "Apparatuses and Methods for Configurable Ecc Modes" filed Nov. 8, 2023; all pages of application as filed.

U.S. Appl. No. 18/504,324 titled "Apparatuses and Methods for Single-Pass Access of ECC Information, Metadata Information or Combinations Thereof", filed Nov. 8, 2023, all pages of application as filed.

U.S. Appl. No. 18/504,342 titled "Apparatuses and Methods for Single-Pass Access of ECC Information, Metadata Information or Combinations Thereof" filed Nov. 8, 2023; pp. all pages of application as filed.

U.S. Appl. No. 18/504, 353 titled "Apparatuses and Methods for Separate Write Enable for Single-Pass Accessof Data, Metadata, and Parity Information" filed Nov. 8, 2023; pp. all pages of application as filed.

U.S. Appl. No. 18/504,362 titled "Apparatuses and Methods for Separate Write Enable for Single-Pass Access of Data, Metadata, and Parity Information" filed Nov. 8, 2023; pp. all pages of application as filed.

U.S. Appl. No. 17/730,396, titled "Apparatuses, Systems, and Methods for Per Row Error Scrub Information Registers", filed Apr. 27, 2022; pp. all pages of application as filed.

U.S. Appl. No. 17/730,992 titled "Mode Register for Blocking Direct Access To Meta Data" filed Apr. 27, 2022, pp. all pages of application as filed.

(56) References Cited

OTHER PUBLICATIONS

U.S. Appl. No. 17/731,024 titled "Apparatuses, Systems, and Methods for Managing Metadata Storage At a Memory" filed Apr. 27, 2022, KNE.
U.S. Appl. No. 17/730,992 titled "Apparatuses, Systems, and Methods for Managing Metadata Security and Access" filed Apr. 27, 2022, KNE.
U.S. Appl. No. 19/360,159 titled "Apparatuses and Methods for Enhanced Metadata 1 Support" filed Oct. 16, 2025; pp. all pages of the application as filed.
U.S. Appl. No. 18/625,539, titled "Apparatuses, Systems, and Methods for Per Row Error Scrub Information" filed Apr. 3, 2024, pp. all pages of application as filed.
International Search Report and Written Opinion for PCT/US2023/076430, mailed on Feb. 13, 2024; all pages of report.
U.S. Appl. No. 18/441,775 titled "Apparatuses and Methods for Settings for Adjustable Write Timing" filed Feb. 14, 2024, pp. all pages of the application as filed.
U.S. Appl. No. 18/441,830 titled "Apparatuses, Systems, and Methods for Storing and Accessing Memory Metadata and Error Correction Code Data" filed Feb. 14, 2024, pp. all pages of the application as filed.
U.S. Appl. No. 19/025,934, titled "Apparatuses, Systems, and Methods for Managing Metadata Security and Access" filed Jan. 16, 2025, pp. all pages of application as filed.
U.S. Appl. No. 18/734, 189, titled "Apparatuses, Systems, and Methods for Managing Metadata Storage At a Memory" filed Jun. 5, 2024, pp. all pages of application as filed.
U.S. Appl. No. 18/743,994 titled "Apparatuses and Methods for Shared Codeword in 2-PASS Access Operations" filed Jun. 14, 2024, pp. all pages of the application as filed.
U.S. Appl. No. 18/745,577 titled "Apparatuses and Methods for Half-Page Modes of Memory Devices" filed Jun. 17, 2024, pp. all pages of the application as filed.
U.S. Appl. No. 18/745,843 titled "Apparatuses and Methods for Half-Page Modes of Memory Devices" filed Jun. 17, 2024, pp. all pages of the application as filed.
U.S. Appl. No. 18/745,877 titled "Apparatuses and Methods for Half-Page Modes of Memory Devices" filed Jun. 17, 2024, pp. all pages of the application as filed.
U.S. Appl. No. 18/745,894 titled "Apparatuses and Methods for Half-Page Modes of Memory Devices" filed Jun. 17, 2024, pp. all pages of the application as filed.
U.S. Appl. No. 18/747,658, titled "Apparatuses and Methods for Bounded Fault Compliant Metadata Storage" filed, pp. all pages of application as filed.
U.S. Appl. No. 18/747,676, titled "Apparatuses and Methods for Alternate Memory Die Metadata Storage", filed Jun. 19, 2024, pp. all pages of application as filed.
U.S. Appl. No. 18/747,696, titled "Apparatuses and Methods for Scalable 1-PASS Error Correction Code Operations", filed Jun. 19, 2024, pp. all pages of application as filed.
U.S. Appl. No. 18/747,712, titled "Apparatuses and Methods for Granular Single-Pass Metadata Access Operations" filed Jun. 19, 2024, pp. all pages of application as filed.
U.S. Appl. No. 18/747,635, titled "Apparatuses and Methods for Read/Modify/Write Single-Pass Metadata Access Operations" filed Jun. 19, 2024, pp. all pages of application as filed.
PCT Application No. PCT/US24/39192 titled "Apparatuses and Methods for Scalable 1-Pass Error Correction Code Operations" filed Jul. 23, 2024, pp. all pages of the application as filed.
PCT Application No. PCT/US24/39195 titled "Apparatuses and Methods for Half-Page Modes of Memory Devices" filed Jul. 23, 2024, pp. all pages of the application as filed.
PCT Application No. PCT/US24/39231 titled "Apparatuses and Methods for Granular Single-Pass Metadata Access Operations" filed Jul. 24, 2024, pp. all pages of the application as filed.
U.S. Appl. No. 19/366,908 titled "Apparatuses and Methods for Configurable ECC Modes", filed Oct. 23, 2025; pp. all pages of application as filed.
U.S. Appl. No. 19/376,027 titled "Apparatuses and Methods for Single-Pass Access of ECC Information, Metadata Information or Combinations Thereof", filed Oct. 31, 2025; pp. all pages of application as filed.
U.S. Appl. No. 19/381,448 titled "Apparatuses and Methods for Enhanced Metadata Support", filed Nov. 6, 2025; pp. all pages of application as filed.
U.S. Appl. No. 19/431,541, titled "Apparatuses And Methods For Bounded Fault Compliant Metadata Storage" filed Dec. 23, 2025, pp. all pages of application as filed.
U.S. Appl. No. 19/435,124 titled "Apparatuses, Systems, and Methods for Storing Memory Metadata", filed Dec. 29, 2025; pp. all page of the application as filed.
U.S. Appl. No. 19/441,648, titled "Apparatuses, Systems, and Methods for Storing and Accessing Memory Metadata and Error Correction Code Data" filed Jan. 6, 2026; pp. all pages of application as filed.

* cited by examiner

APPARATUSES AND METHODS FOR SEPARATE WRITE ENABLE FOR SINGLE-PASS ACCESS OF DATA, METADATA, AND PARITY INFORMATION

CROSS REFERENCE TO RELATED APPLICATION(S)

This application claims the benefit under 35 U.S.C. § 119 of the earlier filing date of U.S. Provisional Application Ser. No. 63/383,738 filed Nov. 15, 2022, the entire contents of which are hereby incorporated by reference in their entirety for any purpose.

BACKGROUND

This disclosure relates generally to semiconductor devices, and more specifically to semiconductor memory devices. In particular, the disclosure relates to volatile memory, such as dynamic random access memory (DRAM). Information may be stored on individual memory cells of the memory as a physical signal (e.g., a charge on a capacitive element). During an access operation, an access command may be received along with address information which specifies which memory cells should be accessed.

There is a growing interest in enabling the memory to store information in the array which is associated with pieces of data. For example, error correction information and/or metadata may be stored in the array along with their associated data. There may be a need to ensure that such information can be accessed along with the specified data without unduly impacting the performance of the device.

DETAILED DESCRIPTION

Figure 1:
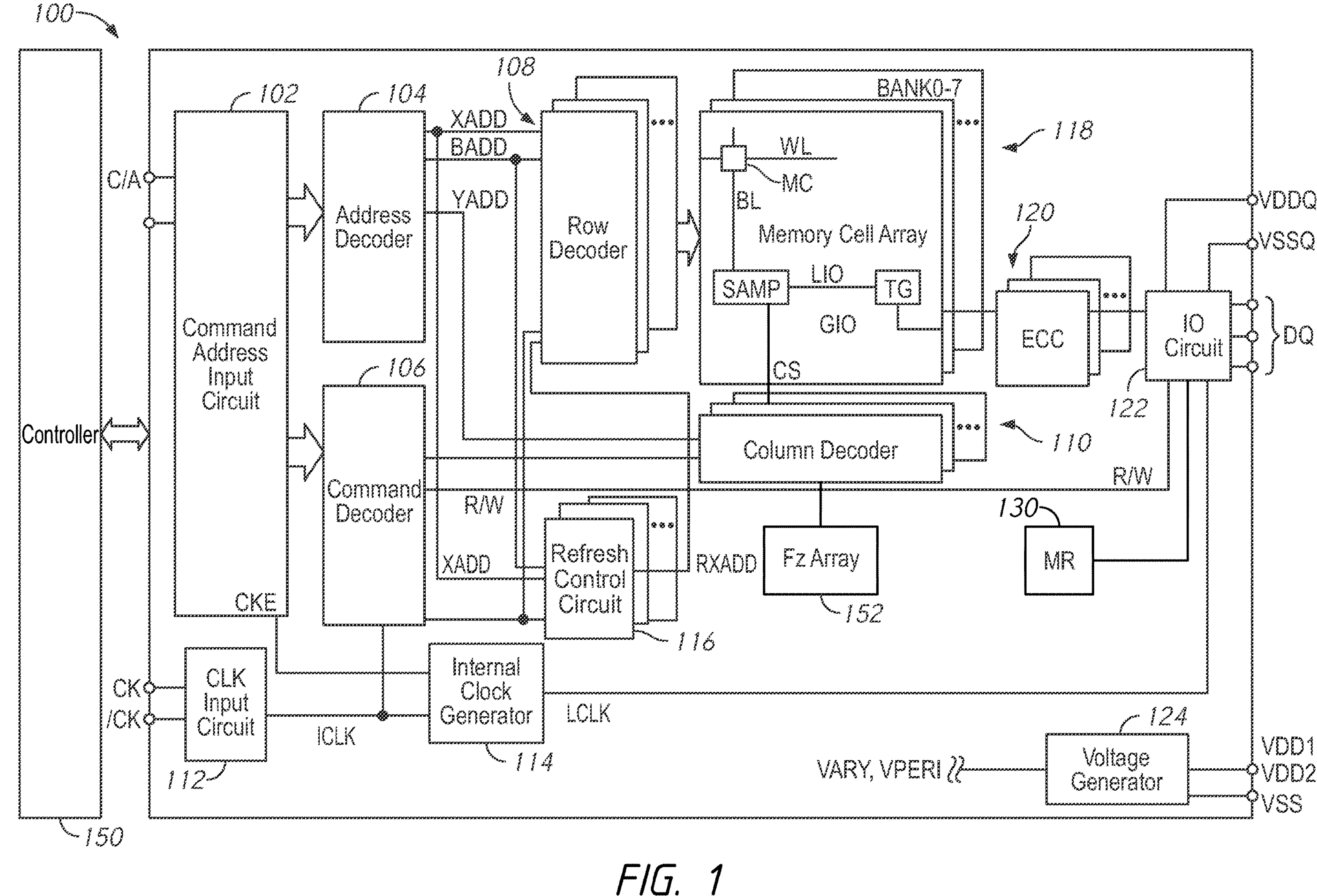
FIG. 1 is a block diagram of a semiconductor device according an embodiment of the disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Memory arrays may generally include a number of memory cells arranged at the intersection of word lines (rows) and bit lines/digit lines (columns). The columns may be grouped together into column planes, and a column select (CS) signal may be used to select a set of columns within each of the active column planes to provide data. When an access command is received, the memory may prefetch a codeword (e.g., a number of bits of data) along with one or more associated bits from the memory and either replace the prefetched data with new data (e.g., as part of a write operation) or provide the prefetched data off the memory device (e.g., as part of a read operation). Some memory modes may involve providing less than all of the prefetched data off the memory device. For example, in a conventional memory device, in certain modes half of the prefetched data may be provided off the device, and the remainder may ignored.

Memory devices may store additional information which is associated with each codeword. For example, the additional information may include parity bits which are used as part of an error correction scheme, metadata which includes information about the data codeword (or is a portion of information about a larger set of data which includes the codeword), or combinations thereof. However, the maximum number of bits which can be retrieved as part of a single access pass may be limited by the architecture of the memory, and this number may generally be based on a maximum number of data bits in the codeword plus some number of additional bits (e.g., 128 data bits+8 additional bits).

As used herein, the term data may represent any bits of information that the controller wishes to store and/or retrieve from the memory. The term metadata may represent any bits of information about the data which the controller writes to and/or receives from the memory. For example, the metadata may be information that the controller generates about the data, about how or where the data memory is stored in the memory, about how many errors have been detected in the data, etc. The data and the metadata together represent information written to the memory by a controller and then also read from the memory by the controller, with the data and metadata differing in content and how they are generated in that the metadata is based on information about the data. The term parity may represent any bits generated by an error correction circuit of the memory based on the data, metadata, or combinations thereof. The parity may generally stay within the memory. In some embodiments, the amount of data and/or metadata retrieved as part of a single access operation may represent a set of bits which are a fragment of a larger piece of information. For example, the metadata bits retrieved as part of a single access operation (e.g., 4 bits) may not have any meaning on their own, but may have meaning when combined with sets of metadata bits retrieved as part of other access operations (e.g., to other memory arrays and/or to the same array at different times).

Some memories may include a set of data column planes, and an extra column plane which stores additional information. However, it may be desirable to include a greater number of bits additional information than can be retrieved from the extra column plane for various applications (e.g., to include parity bits and metadata, to include more parity bits, etc.). Some memory devices may use a 'two-pass' architecture, where at least some of the additional bits are retrieved first, stored, and then a second access pass retrieves the codeword data bits. However, this may incur a penalty to the latency of any given access operation. There may be a need for one-pass or single-pass storage of extended additional information, such that the codeword and the additional bits are retrieved as part of a single access pass to the memory array.

The present disclosure is drawn to apparatuses, systems, and methods for single-pass access of ECC information, metadata information, or combinations thereof along with the associated codeword. Some memory devices may operate in mode where fewer than all of the data bits which can be prefetched are provided off the device. For example, a memory device may prefetch 128 data bits as part of a codeword in an x8 or x16 mode, however in an x4 memory mode, a 64 bit codeword is provided at data terminals of the device. The data bits of the codeword in the x4 memory mode are stored in some, but not all of the data column planes (e.g., half of the column planes). Which half of the data column planes is selected may be based on the column address. Additional bits (e.g., parity bits and/or metadata bits) associated with the data may be stored both in the extra column plane, and also in data column planes which are not selected by the column address as part of the current access.

According to some embodiments of the current disclosure, an example memory device may include a set of data column planes and an extra column plane. The memory may be set in a mode where metadata is stored along with its associated data. When an access operation is performed, a column select signal with a first value is provided to columns in a first portion of the data column planes and to the extra column plane and a column select signal with a second value is provided to one or more columns not in the first portion of the data column planes. The memory may store data in the first portion of the data column planes, metadata in the extra column plane, and error correction parity bits in the accessed columns which not in the first portion of the data column planes. In this way, the data for the codeword, the metadata, and the ECC information may be prefetched together as part of a single access pass, without prefetching additional data bits.

In some embodiments, firing a column select signal may retrieve a greater number of bits than are needed. For example, 8 bit lines may be activated, but only 4 bits of metadata per prefetched codeword are needed. To prevent the extra bits from being inadvertently modified, it may be useful to mask those bits from being accessed. The column planes may include two sets of sense amplifiers, each including sense amplifiers which are coupled to every other bit line (e.g., even sense amplifiers and odd sense amplifiers) . During a write operation in one of the data column planes, a write enable signal activates both sets of sense amplifiers. However, in the extra column plane, one or metadata write enable signals may be used. The metadata write enable signals include a first write enable signal (e.g., an even write enable signal) which activates the first set of sense amplifiers and a second write enable signal (e.g., an odd write enable signal) which activates the second set of sense amplifiers. In some embodiments, the even and odd write enable signals may represent two states of a binary metadata write enable signal (e.g., high=write enable even active, low=write enable odd active). A column control circuit may selectively activate one or the other write enable signals, such that half of the bit lines activated by a given column select signal are activated. In this way, only the metadata bits which are needed are accessed in the extra column plane.

To account for this change, a global column redundancy (GCR) plane, used to repair columns may receive either the write enable signal (if the repair was made on a data column plane) or the metadata write enable signal (if the repair was made on the extra column plane). For example, the sense amplifiers in the GCR may be coupled to multiplexers which either pass the write enable signal or the metadata write enable signal depending on where the repair was made. The memory may also include a mode register, which may enable using a metadata write enable signal.

FIG. 1 is a block diagram of a semiconductor device according an embodiment of the disclosure. The semiconductor device 100 may be a semiconductor memory device, such as a DRAM device integrated on a single semiconductor chip. The memory device 100 may be operated by a controller 150. The controller 150 may be a separate device than the memory 100 which stores and retrieves information from the memory 100. For example, the controller 150 may be a processor such as a CPU or GPU. In some embodiments, multiple memory devices may be packaged together into a single memory module, and the controller may send and receive information from multiple memories at the same time. For the sake of clarity. FIG. 1 will be discussed with respect to a single memory device 100.

The semiconductor device 100 includes a memory array 118. The memory array 118 is shown as including a plurality of memory banks. In the embodiment of FIG. 1, the memory array 118 is shown as including eight memory banks BANK0-BANK7. More or fewer banks may be included in the memory array 118 of other embodiments. As explained in more detail herein, each bank may be further divided into two or more sub-banks. While embodiments where each bank includes two sub-banks are generally described herein, other embodiments may include more sub-banks per bank.

Each memory sub-bank includes a plurality of word lines WL, a plurality of bit lines BL, and a plurality of memory cells MC arranged at intersections of the plurality of word lines WL and the plurality of bit lines BL. The selection of the word line WL is performed by a row decoder 108 and the selection of the bit lines BL is performed by a column decoder 110. In the embodiment of FIG. 1, the row decoder 108 includes a respective row decoder for each memory bank and the column decoder 110 includes a respective column decoder for each memory bank. In some embodiments, components such as the row and column decoders and refresh control circuit 116 which are repeated on a per-bank basis may also include components which are repeated on a per-sub-bank basis. For example, there may be a refresh control circuit 116 for each sub-bank.

The bit lines BL are coupled to a respective sense amplifier (SAMP). Read data from the bit line BL is amplified by the sense amplifier SAMP, and transferred to an ECC circuit 120 over local data lines (LIO), transfer gate (TG), and global data lines (GIO). Conversely, write data outputted from the ECC circuit 120 is transferred to the sense amplifier SAMP over the complementary main data lines GIO, the transfer gate TG, and the complementary local data lines LIO, and written in the memory cell MC coupled to the bit line BL. Responsive to a column select (CS) signal, bit lines are selected and their sense amplifiers are coupled to respective LIO lines. Responsive to read or write enable signals, the LIO lines may be coupled to respective GIO lines by the transfer gate TG.

The semiconductor device 100 may employ a plurality of external terminals coupled to the controller 150, such as solder pads, that include command and address (C/A) terminals coupled to a command and address bus to receive commands and addresses, clock terminals to receive clocks CK and/CK, data terminals DQ coupled to a data bus to provide data, and power supply terminals to receive power supply potentials VDD, VSS, VDDQ, and VSSQ.

The clock terminals are supplied by the controller 150 with external clocks CK and/CK that are provided to an input circuit 112. The external clocks may be complementary. The input circuit 112 generates an internal clock ICLK based on the CK and/CK clocks. The ICLK clock is provided to the command decoder 106 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data. The input/output circuit 122 may include a number of interface connections, each of which may be couplable to one of the DQ pads (e.g., the solder pads which may act as external connections to the device 100).

The C/A terminals may be supplied with memory addresses by the controller 150. The memory addresses supplied to the C/A terminals are transferred, via a command/address input circuit 102, to an address decoder 104. The address decoder 104 receives the address and supplies a decoded row address XADD to the row decoder 108 and supplies a decoded column address YADD to the column decoder 110. The decoded row address XADD may be used to determine which row should be opened, which may cause the data along the bit lines to be read out along the bit lines. The column decoder 110 may provide a column select signal CS, which may be used to determine which sense amplifiers provide data to the LIO. The address decoder 104 may also supply a decoded bank address BADD, which may indicate the bank of the memory array 118 containing the decoded row address XADD and column address YADD.

The C/A terminals may be supplied with commands by the controller 150. Examples of commands include timing commands for controlling the timing of various operations, access commands for accessing the memory, such as read commands for performing read operations and write commands for performing write operations, as well as other commands and operations. The access commands may be associated with one or more row address XADD, column address YADD, and bank address BADD to indicate the memory cell(s) to be accessed.

The commands may be provided as internal command signals to a command decoder 106 via the command/address input circuit 102. The command decoder 106 includes circuits to decode the internal command signals to generate various internal signals and commands for performing operations. For example, the command decoder 106 may provide signals which indicate if data is to be read, written, etc. For example the command decoder 106 may provide write enable signals which couple data on the GIO to the LIO, allowing the data on the GIO to be written to the bit lines coupled to the LIOs by the CS signal.

The device 100 may receive an access command which is a read command. When a read command is received, and a bank address, a row address and a column address are timely supplied with the read command, read data is read from memory cells in the memory array 118 corresponding to the row address and column address. The read command is received by the command decoder 106, which provides internal commands, such as a read enable signal, so that read data from the memory array 118 is provided to the ECC circuit 120. The ECC circuit 120 receives data bits, metadata bits, and parity bits from the array and detects and/or corrects errors in the data and metadata bits. The correct read data is provided along the data bus and output to outside from the data terminals DQ via the input/output circuit 122.

The device 100 may receive an access command which is a write command. When the write command is received, and a bank address, a row address and a column address are timely supplied with the write command, write data supplied to the data terminals DQ is provided along the data bus and written to a memory cells in the memory array 118 corresponding to the row address and column address. The write command is received by the command decoder 106, which provides internal commands, such as write enable signals, so that the write data along with metadata is received by data receivers in the input/output circuit 122. The write data and metadata is supplied via the input/output circuit 122 to the ECC circuit 120. The ECC circuit generates parity bits based on the received data and meta data and the data, metadata, and parity are provided by the ECC circuit 120 to the memory array 118 to be written into the memory cell MC.

The device 100 includes refresh control circuits 116 each associated with a bank of the memory array 118. Each refresh control circuit 116 may determine when to perform a refresh operation on the associated bank. The refresh control circuit 116 provides a refresh address RXADD (along with one or more refresh signals, not shown in FIG. 1). The row decoder 108 performs a refresh operation on one or more word lines associated with RXADD. The refresh control circuit 116 may perform multiple types of refresh operation, which may determine how the address RXADD is generated, as well as other details such as how many word lines are associated with the address RXADD.

The ECC circuit 120 may detect and/or correct errors in the accessed data. As part of a write operation, the ECC circuit 120 may receive bits from the IO circuit 122 and generate parity bits based on those received bits. The received bits and parity bits are written to the memory array 118. During an example read operation, the ECC circuit 120 receives a set of bits and their associated parity bits from the array 118 and uses them to locate and/or correct errors. For example, in a single error correction (SEC) scheme, up to one bit of error may be located and detected. In a single error correction double error detection (SECDED) scheme, up to one bit of error may be corrected, but two errors may be detected (although the bits causing those errors are not individually located, so no correction can be made). The ECC circuit 120 may correct the information and then provide the corrected information (and/or a signal indicated detected errors) to the IO circuit 122. The parity bits may generally not be provided to the IO circuit 122.

The mode register 130 may include various settings, and may be used to enable a metadata mode of the memory 100. When metadata is enabled, the device 100 may store metadata which is associated with the data. For example, as part of a write operation the controller may provide data along with its associated metadata, and as part of a read operation may receive data and its associated metadata. In some embodiments, the ECC circuit 120 may include the metadata bits as part of the error correction process and in some embodiments the metadata bits may be excluded. In some embodiments, whether the metadata is included or not in the ECC process may be a setting of the memory (e.g., in a mode register 130). The metadata may include information about the associated data.

The memory 100 may be operated in various modes based on a number of the DQ pads which are used. The mode may determine both how many DQ pads a controller expects to send/receive data along, as well as the format and/or number of bits which the controller expects as part of a single access command. For example, the memory may have 16 physical DQ pads. In an x16 mode, all 16 DQ pads are used. In an x8 mode eight of the DQ pads are used, and in an x4 mode, four of the DQ pads are used. The mode may also determine a burst length at each DQ terminal as part of a DQ operation. The burst length represents a number of serial bits at each DQ terminal during an access operation.

For example, an x8 mode, the memory may send or receive 128 data bits along 8 DQ terminals, each of which has a burst length of 16. In an example x4 mode, a burst length of 16 may also be used, and thus 64 bits may be sent or received as part of the access operation. The present disclosure will generally be described with respect to an example embodiment where as part of an x4 mode a codeword of 64 data bits is accessed along with 4 bits of metadata, and the ECC circuit 120 uses 8 bits of ECC parity. Other example embodiments may use different numbers of data, metadata, and parity.

The device 100 includes a mode register 130 which may be used to control various optional modes of the memory. For example, the mode register 130 may include a setting which determines if metadata is used or not. If metadata is enabled, the mode register 130 may set a first x4 operational mode (e.g., a two-pass x4 operational mode) or a second x4 operational mode (e.g., a one-pass x4 operational mode). The controller may perform a mode register write (MRW) operation to set values in the mode register 130, or may perform a mode register read (MRR) operation to check what values in the mode register 130 are. The mode register 130 includes a number of registers, each of which may store one or more bits which correspond to a setting or piece of information about the memory. When the memory is in the one-pass x4 operational mode, a further setting of the mode register 130 may be used to set the memory in a separated write enable mode or a common write enable mode in the extra column plane as described in more detail herein.

The controller 150 may provide a command as well as row and column addresses as part of an access operation. In the two-pass x4 operational mode, responsive to the access operation from the controller, the column decoder may perform a first access pass on the memory array to retrieve a first portion of the information which may then be stored, and then perform a second access pass on the memory array to retrieve a remainder of the information, which is combined with the stored information. For example, during a read operation, the controller may provide addresses and a single read command, but responsive to that, the memory 100 may retrieve the 4 metadata bits as part of a first pass, and then retrieve the remaining 64 data bits and 8 parity bits as part of a second pass. In the single-pass x4 operational mode, responsive to addresses and a read command, the memory may retrieve the data, metadata, and parity as part of a single access pass on the memory array.

The memory device 100 may also be repaired. The memory includes a fuse array 152, which includes a number of non-volatile storage elements (e.g., fuses or anti-fuses). The state of the fuses in the fuse array 152 may be used to encode information permanently in the memory 100. For example, an address which has been repaired may be programmed in the fuse array 152. When an address is received as part of an access operation, if the address matches an address repaired in the fuse array 152, then the memory may access a redundant row or column of memory instead.

The power supply terminals are supplied with power supply potentials VDD and VSS. The power supply potentials VDD and VSS are supplied to an internal voltage generator circuit 124. The internal voltage generator circuit 124 generates various internal potentials VARY, and the like based on the power supply potentials VDD and VSS supplied to the power supply terminals.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
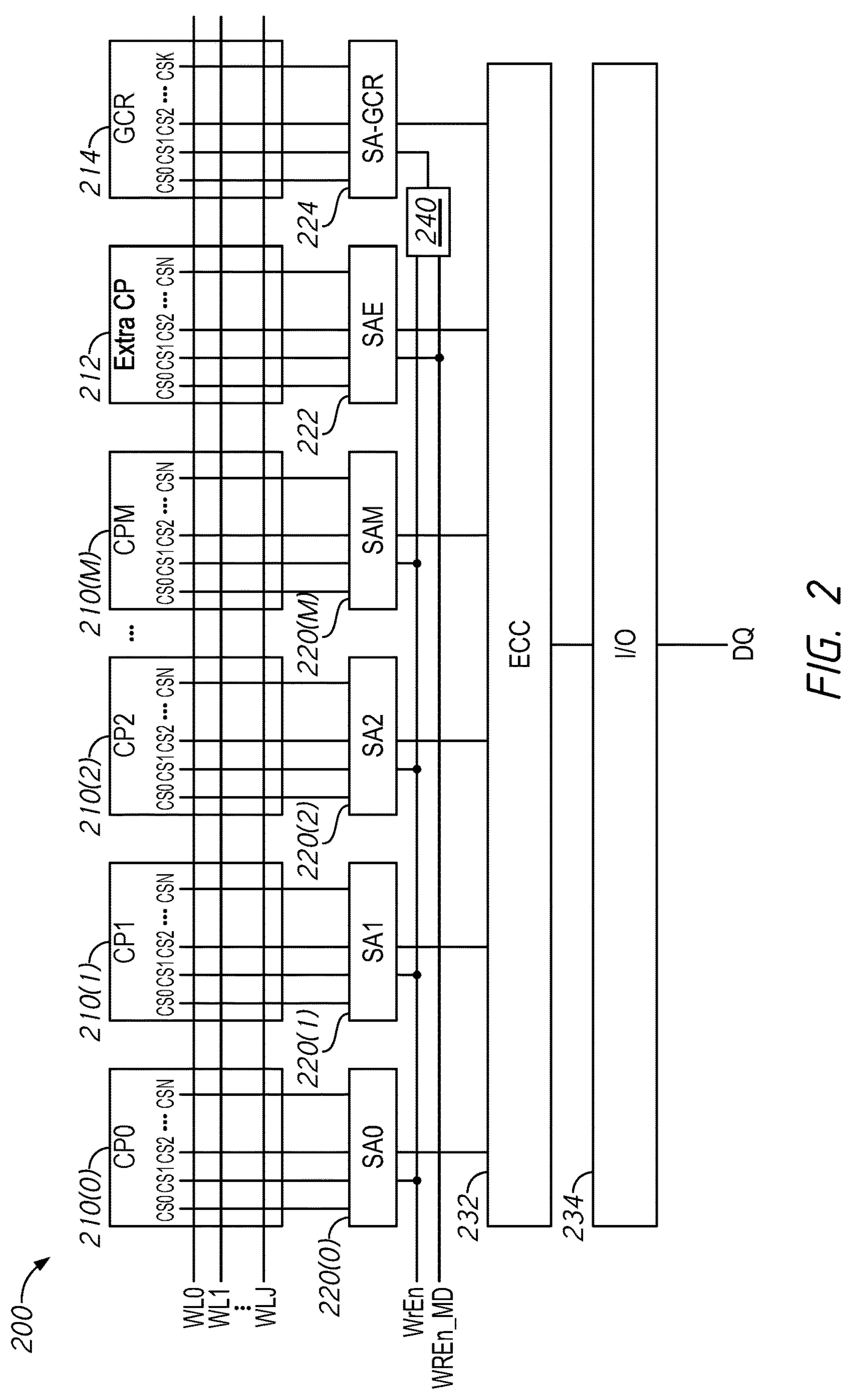
FIG. 2 is a block diagram of a memory device according to some embodiments of the present disclosure.

FIG. 2 is a block diagram of a memory device according to some embodiments of the present disclosure. The memory device 200 may, in some embodiments, represent a portion of the memory device 100 of FIG. 1. The view of FIG. 2 shows a portion of a memory array 210-214 and 220-224 which may be part of a memory bank (e.g., 118 of FIG. 1) along with selected circuits used in the data path such as the ECC circuit 232 (e.g., 120 of FIG. 1) and IO circuits 234 (e.g., 122 of FIG. 1). For clarity certain circuits and signals have been omitted from the view of FIG. 2.

The memory device 200 is organized into a number of column planes 210-214. Each of the column planes represents a portion of a memory bank. Each column plane 210-214 includes a number of memory cells at the intersection of word lines WL and bit lines. The bit lines may be grouped together into sets which are activated by a value of a CS signal. For the sake of clarity, only a single vertical line is used to represent the bit lines of each column select set, however, there may be multiple columns accessed by that value of CS. For example, each line may represent 8 bit lines, all accessed in common by a value of CS. For example, there may 8 LIOs for each column plane, and the CS signal may be used to determine which bit lines are coupled (through their respective sense amplifiers) to those LIOs. As used herein, a 'value' of CS may refer to a decoded signal provided to sets of bit lines. So a first value may represent a first value of a multibit CS signal, or after decoding a signal line associated with that value being active. The wordlines may be extend across multiple of the column planes 210-214.

The memory 200 includes a set of data column planes 210 as well as an extra column plane 212. The extra column plane 212 may be used to store additional information, such as error correction parity bits or metadata bits.

In some embodiments, the memory 200 may also include a global column redundancy (GCR) column plane 214. In some embodiments, the GCR plane 214 may have fewer memory cell(e.g., fewer column select groups) than the data column planes 210. The GCR CP 214 includes a number of redundant columns which may be used as part of a repair operation. If a value of the CS signal is identified as having been repaired (e.g., it matches an address stored in the fuse array 152 of FIG. 1), then the memory may be remapped such that the data which would have been stored in that column plane for that value of CS is instead stored in the GCR CP 214.

As well as the column select signals from the column decoder, during a write operation the column timing logic in the bank area provides a write enable signal WrEN to transfer gates associated with the data column planes 210 and a metadata write enable signal WrEN_MD to transfer gates associated with the extra column plane 212. Both write enable signals are provided through logic circuits 240 to the transfer gates associated with the GCR column plane 214. For clarity a single box is shown as the logic circuits 240, however, there may be a logic circuit 240 for each transfer gate (e.g., each LIO/GIO). The column select signals CS determine which sense amplifiers (and thus which bit lines) are coupled to the corresponding LIOs. The write enable signals WrEn and WrEn_MD, when active, couple the LIOs to the GIs, allowing data along the GIO to be written along the LIO through the active sense amplifier and to the memory cell at the intersection with the active word line. When the write enable signals are inactive, the LIOs may remain uncoupled from the GIOs, similar to a read operation. Accordingly, when the write enable signal is inactive, data cannot be written to the bit lines selected by CS.

As described in more detail herein, the sense amplifiers 220, 222, and 224 may be divided into two regions, an even region and an odd region. The different regions include sense amplifiers coupled to alternating bit lines. For example, the even sense amplifier region includes sense amplifiers coupled to even numbered bit lines, and the odd sense amplifier region includes sense amplifiers coupled to odd numbered bit lines. Similarly, there may be corresponding even and odd LIOs and GIOs associated with those regions. The write enable signal WrEn activates transfer gates associated with both the even and odd sense amplifier regions in the sense amplifiers 220 when it is active. The metadata write enable signal WrEn_MD activates either transfer gates associated with the even or the odd sense amplifier region of the extra sense amplifiers 222, but not both at the same time. The transfer gates associated with the GCR sense amplifiers 224 may be activated by either WrEn or WrEn_MD depending on which of those signals is provided by the logic 240. For example, if a given transfer gate is provided with WrEn_MD, then only the even or odd sense amplifiers in that set will be coupled to the GIO as part of that write operation.

In an example embodiment, the memory 210 may include 16 data column planes 210(0)-210(15). Each of those data column planes 210 includes 64 sets of bit lines which may be selected by a corresponding value of the column select signal (e.g., CS0 to CS63), and each set of bit lines includes 8 bit lines which are coupled to a corresponding LIO when the CS signal has that value. Accordingly, when a word line is opened responsive to a row address, and a column select signal is provided to all of the 16 column planes (e.g., as part of an x8, x16 or two-pass x4 mode) then 8 bits are accessed from each of the 16 data column planes 210 for a total of 128 bits. A column select signal is also provided to the extra column plane 212, which may or may not have the same value as the CS signal provided to the data column planes 210 for up to an additional 8 bits. If a repair has been performed, the GCR CP 214 may also be accessed and the value on a GCR LIO may be used while ignoring the LIO of the column plane it is replacing. Accordingly, the maximum number of bits that can be retrieved as part of an access pass is 128 bits from the data column planes 210 (with 8 bits substituted from the GCR CP 214 if there has been a repair) along with 8 additional bits from the extra CP 212.

The memory may be operated in an x4 mode, where fewer than the maximum number of bits which could be accessed are send from/provided to an external device such as controller 150 of FIG. 1. For example, in an x4 mode, the controller may send/receive 64 data bits instead of 128. The column address may indicate which of the column planes 210 are used to store the data accessed in a x4 mode. For example, a CP select bit of the column address (e.g., a 0 bit of the column address, C10) may select data from even column planes or odd column planes or from a first half of the column planes or a second half of the column planes. Other schemes may be used in other example embodiments.

A mode register (e.g., 130 of FIG. 1), not shown in FIG. 2), may be used enable metadata on the device. If metadata is enabled, the mode register may have settings which set the memory device in a first x4 operational mode (a two-pass mode) or a second x4 operational mode (a one-pass mode). In both operational modes, the overall information received from/sent to an external device is the same. For example, a controller of the memory may expect 64 data bits and 4 metadata bits for each access of the memory 200 in either mode, however, the operational modes may determine how the memory array is accessed, how many access passes are used to fetch the data (e.g., how quickly the data is accessed), the power consumption of the access operation, the size of the prefetched information, the behavior of the ECC circuit 232, and which information is stored in what column planes. In the first x4 operational mode, two access passes are used to retrieve the data (e.g., the metadata from a first pass and the data and ECC bits from a second pass), while in the second x4 operational mode, a single pass is used to retrieve the information.

In an example read command in the first (two-pass) x4 operational mode, a column, row and bank address are received from the controller. A row decoder (e.g., 108 of FIG. 1) opens a selected word line based on the row address. The column decoder generates column select signals based on the column address. As part of a first access pass, a column select signal is provided to one of the column planes 210 which is selected by the CP select bit of the column address (e.g., C10). A set of metadata (e.g., 128 metadata bits), some of which is associated with the current access operation is retrieved from the column planes 210 along with parity bits (associated with that set of metadata) from the extra column plane 212. The ECC circuit 232 may check and correct errors based on the 128 metadata bits+8 associated parity bits. The metadata bits within that set (e.g., 4 metadata bits) which are associated with the current access operation (e.g., as indicated by the column address) are stored in a buffer (not shown) as part of the IO circuit 234. As part of a second access pass, the column select signal is provided to all of the data column planes 210 and an extra column select signal is provided to the extra column plane. The column select signal and the extra column select signal have the same value as each other and do not necessarily have the same value of the column select signal provided as part of the first access pass. As part of the second access pass, data bits are retrieved from the data column planes 210 and parity bits are retrieved from the extra column plane 212. The ECC circuit 232 uses the retrieved data and parity bits to locate and/or correct errors in the data. Half of the retrieved (corrected) data bits are then concatenated with the previously retrieved metadata in the IO circuit 234, and the 10 circuit provides the data and metadata off the device at the DQ pads.

An example write command in the first x4 operational mode may be generally similar. The controller provides data bits and metadata bits along with commands and addresses such as the write enable signals WrEn. In the first (two-pass) x4 operational mode, the signal WrEn may be provided to the extra sense amplifiers 222, and both even and odd sense amplifiers may be activated together. The metadata is stored in a buffer of the IO circuit 234. Data is prefetched from the array and half of that data is replaced with the new write data. The ECC circuit 232 then generates new parity from the updated set of data, and the data is written to the data column planes 210. In a similar fashion, in a second access pass, the set of metadata is retrieved so that the metadata can be added to it and the ECC circuit 232 can generate new parity associated with the updated set of metadata. The updated set of metadata and the parity is then written to the array. In a second access pass, while the parity is written to the extra column planes 212.

There may be a latency time tCCD_L_WR which is part of the design specification of the memory. The time tCCD_L_WR represents a minimum amount of time which must elapse before a bank in the same bank group can be accessed again. The time tCCD_L_WR represents a long column-to-column (or command) delay period for writes, which may be a specification of the memory. During a write operation the two-pass operational mode may incur a latency of 2×tCCD_L_WR since each access pass requires a delay of tCCD_L_WR before the bank can be accessed again. One tCCD_L_WR is incurred from adding an extra pass to overwrite the metadata, and an additional tCCD_L_WR is incurred because in order to generate parity bits, which are based off of all of the prefetched data in this mode, the half of the prefetched data bits which are not being written must still be prefetched (e.g., read) so that they can be added to the write bits received from the controller.

The second x4 operational mode may be a 'one-pass' mode where fewer data bits are prefetched and the locations of the metadata and parity are changed compared to the first x4 operational mode. Instead of prefetching additional data bits which are not part of the access operation as in the first x4 operational mode, in the second x4 operational mode, only the accessed data bits are prefetched.

In an example read command in the second x4 operational mode (when the separate write enable mode is disabled), a column, row and bank address are received from the controller. A row decoder (e.g., 108 of FIG. 1) opens a selected word line based on the row address. The column decoder generates column select signals based on the column address. As part of a single access pass, a column select value with a first value is provided to a first portion of the column planes, and a column select signal with a second value is provided to at least one column plane not in the first portion. Along with that a column select signal (which may or may not have the same value of the first or the second column select signals) is provided to the extra column plane 212. Which columns are in the first portion may be based on the CP select bit of the column address (e.g., C10). The data column planes of the first portion provide the data bits, the data column plane not in the first portion provides the ECC parity bits, and the extra column plane 212 provides the metadata bits. During the second x4 operational mode, since only a portion of the column planes 210 are accessed, only the number of data bits which are provided to/from off the device are accessed (along with the metadata and ECC bits). The ECC circuit 232 receives the data and the metadata along with the parity bits, and locates and/or corrects any errors in the data and metadata. The (corrected) data and (corrected) metadata is provided to the 10 circuit 234 which provides the data and metadata to the DQ terminals.

In an example write command in the second x4 operational mode (when the separate write enable mode is disabled), a column, row, and bank address are received from the controller along with data and metadata. The data and metadata are provided through the IO circuit to the ECC circuit, which generates parity bits based on the data and the metadata and then writes the data, metadata and parity to column planes accessed in a similar fashion as described with respect to the read operation. A column select and WrEn signal are also provided to the extra sense amplifiers 222. Accordingly, when the separate write enable mode is disabled, the number of bits retrieved when a column in the extra column plane is accessed (e.g., 8) may be greater than the specified number of metadata bits (e.g., 4). To protect the extra bits from being overwritten, the metadata may be prefetched (e.g., read) and then the new metadata overwrites some of the bits as part of a read modify write (RMW) cycle. This may incur a tCCD_L_WR penalty ( ). However, since only a single extra tCCD_L_WR penalty is incurred (as compared to two for the two-pass 4×operational mode), the single-pass mode may have reduced latency.

The separate write enable mode may further reduce the latency of the write operation by masking the extra metadata bits such that only the four metadata bits associated with the accessed data bits can be written to. In the separate write enable mode, the signal WrEn_MD is provided to the sense amplifiers 222 of the extra column plane 212. The metadata write enable signal WrEn_MD activates either even or odd sense amplifiers, but not both at the same time. The state of WrEn_MD may be based on the column plane select bit (e.g., CO) of the column address. For example, the column select signal may indicate a group of 8 bit lines, and their associated 8 sense amplifiers. LIOs and GIOs. When the column select is active, all 8 sense amplifiers are coupled to their respective LIOs. However, the state of the WrEn_MD signal determines whether even or odd of those LIOs are coupled to their respective GIOs. In this way, only the selected even or odd LIOs (and thus bit lines) may be written to. This may remove the need for an RMW cycle to protect the extra bits. In turn, this may remove the extra RMW latency penalty from the x4 one-pass operational mode when separate write enable signals are enabled.

When a column repair is made, information may be programmed into a fuse array (e.g., 152 of FIG. 1) to remap a column to the GCR column plane 214. After the repair, when a column address is received, it may be compared to the repaired column addresses in the fuse array, and if there is a match, then an enable signal is provided to the GCR column plane 214 along with the corresponding column select signal. The data on the LIO for the column plane which includes the defective row may then be swapped with the GCR LIO such that it is memory cells in the GCR column plane 214 instead of the column plane with the damaged bit line which are accessed.

When the separate write enable mode is enabled, the behavior of write enable is different for the data column planes 210 and the extra column plane 212. If the repaired CS value is in a data column plane 210 then logic circuits 240 associated with that CS value in the GCR-CP 214 may pass the write enable signal WrEn. If the repaired CS value is in the extra column plane 212 that has the metadata, then the logic 240 associated with that CS value passes WrEn_MD. In this way the repair may function in a way which matches the set of columns which were repaired.

In the first (two-pass) x4 operational mode, each of the data column planes 210 stores a mix of data and metadata, with ECC parity bits stored in the extra column plane 212. In the second (one-pass) x4 operational mode, each of the data column planes 210 stores a mix of data and ECC parity bits, and the metadata is stored in the extra column plane 212. In the single-pass mode, the ECC circuit 232 locates and corrects errors in both the data and the metadata (e.g., because the parity is based on both the data and metadata). In the two-pass mode, the ECC circuit 232 only locates and corrects errors in the data in one cycle, while the errors in the metadata are corrected in the other cycle. In other words, in the one-pass mode the parity bits are based on both the data and the metadata, while in the two pass mode there are separate parity bits for the data and metadata.

In the separate write enable mode, only the four bits of metadata which are provided to/received from the controller are provided to the ECC circuit 232. When the separate write enable mode is disabled, the ECC circuit operates on both the selected four bits of metadata and the non-selected four bits accessed along with it. To accommodate this difference, when the separate write enable mode is enabled, during a read operation, the 8 bits are accessed and the extra bits may be discarded so that only the 4 selected metadata bits are provided to the ECC circuit 232. For example, the ECC circuit 232 may include an ECC read mask circuit which passes a selected half of the GIO lines from the extra column plane based on the column plane select bit (e.g., C10) or one of the CS addresses such as CA9. This address will select data from the even or odd senseamp stripe.

In addition, an access in the one-pass x4 operational mode may draw less power than an access in the two-pass x4 operational mode. In the two-pass operational mode, all of the column planes are activated and the data read from their sense amplifiers 220 is driven along LIOs to the ECC circuit 232, along with the sense amps 222 and LIOs associated with the extra column plane 212 (and if there's been a repair the sense amps 224 and LIOs of the GCR 214). However, in the one-pass x4 operational mode, only a selected portion (e.g., half) of the data column planes 210 are activated and therefore less than all of the data LIOs are driven by the respective sense amplifiers 220. Similarly, various switches, signal lines, etc. may also not be used in every access of the one-pass x4 operational mode. Accordingly, less power is drawn in an x4 operational mode then in the two-pass x4 operational mode. Even less power may be drawn when the separate write enable mode is enabled, as fewer LIOs are driven during an write operation and fewer GIOs are driven during a read.

Figure 3:
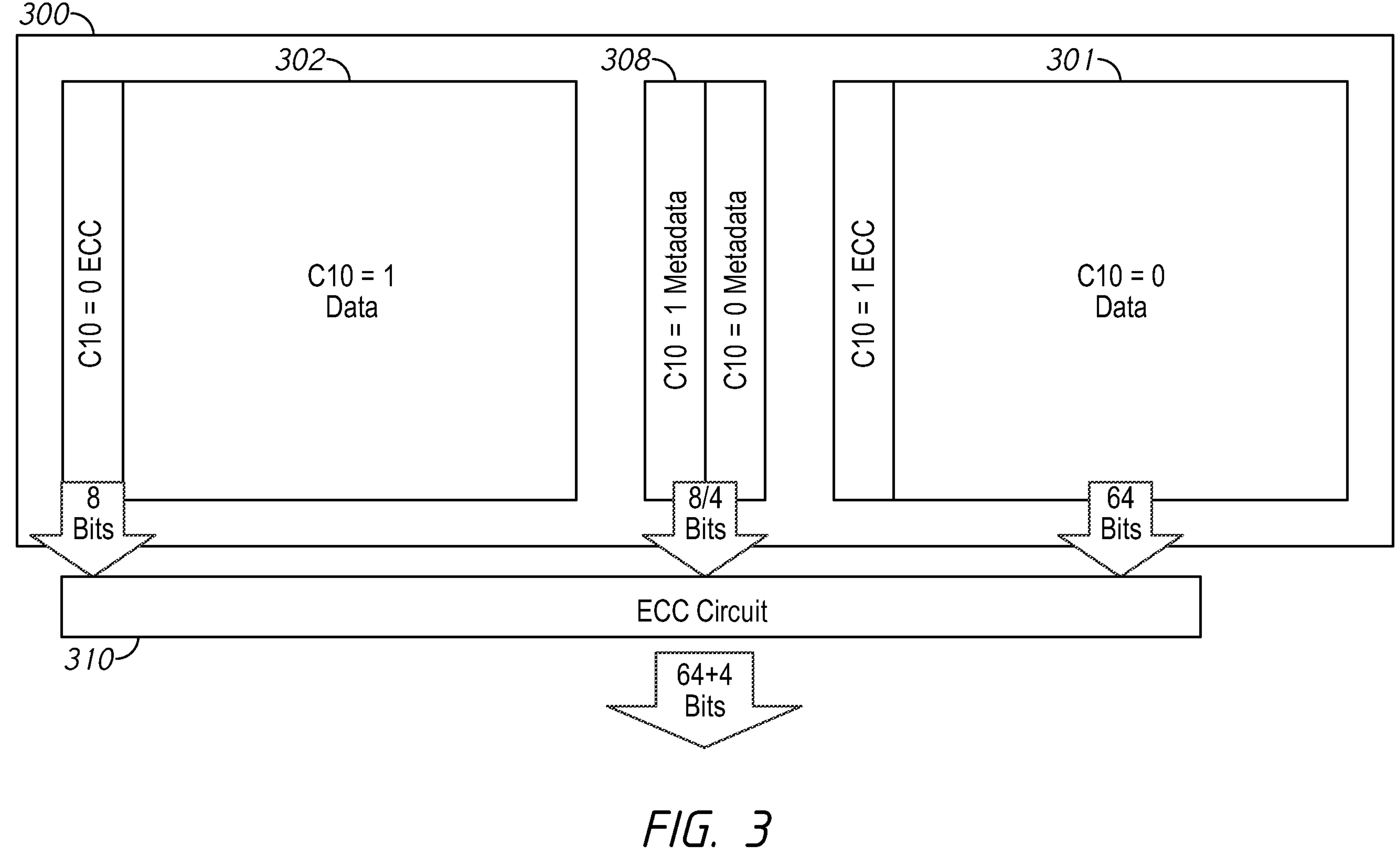
FIG. 3 is a block diagram showing an example of a read operation of a memory according to some example embodiments of the present disclosure.

FIG. 3 is a block diagram showing an example of a read operation of a memory according to some example embodiments of the present disclosure. FIG. 3 shows a view of a memory array 300 which shows a representation of what portions of the memory array are set aside for different types of information. The blocks shown in FIG. 3 represent portions of a memory array, but do not necessarily represent a spatial layout of where information is stored in the memory array. The memory array 300 may, in some embodiments, be an implementation of a memory array 118 of FIG. 1 and/or the column planes 210-214 of FIG. 2 in a second x4 operational mode as described herein.

FIG. 3 is described with respect to an example embodiment where there are 16 data column planes, each of which provides 8 bits when activated by a column select signal, and an extra column plane which also provides 8 bits when activated by its respective column select value. The example memory is operated in an x4 mode where 64 data bits and 4 metadata bits are accessed by the controller. A CP select bit C10 of the column address is used to determine which column planes provide the data.

During an example read operation where C10 is in a low logical state (e.g., C10=0), 8 column planes are accessed in a first portion 301 of the memory array 300, each of which provides 8 bits for a total of 64 data bits. A second column select is also provided to a column plane in the second portion 302. That second column select signal is provided to a single column plane, and a total of 8 ECC parity bits are retrieved. A column select signal is also provided to the extra column plane 308, which provides 8 metadata bits. If the device is in a separate write enable mode then half of those bits are selected (based on the state of C10) and provided to the ECC circuit 310, while the non-selected bits are discarded. If the device is not in the separate write enable mode then the selected 4 out of the 8 bits are provided to the ECC circuit. The ECC circuit 310 (e.g., 232 of FIG. 2) receives 64 data bits along with the 4 metadata bits and 8 parity bits, and provides 64 data bits along with 4 metadata bits. Which of the eight retrieved bits from the extra column plane are provided as the four metadata bits are provided may be based on C10 or a different column address bit (e.g., C9).

In another example read operation where the C10 has the opposite value (e.g., C10=1) then the 64 data bits may be accessed from the second portion 302, the 8 parity bits from the first portion 301 and the metadata bits from the extra column plane 308.

In an example write operation when the separate write enable mode is disabled, since 8 metadata bits are accessed, but only four are actually specified by the access operation, the extra 4 metadata bits may be protected. For example, the memory 300 may employ a read-modify-write (or RMW) strategy where all 8 metadata bits are prefetched, and then four of those bits are changed (as necessary) based on the newly written metadata, and then all 8 bits are written back. The ECC circuit 310 generates parity based on the updated set of 8 bits. This may protect the extra four bits (so they are not inadvertently changed by a direct write operation, since no data is being written to those cells), at the cost of extra latency (e.g., tCCD_L_WR required for the RMW).

In an example write operation when the separate write enable mode is enabled, only the four metadata bits selected by the column plane select bit of the column address are accessed. The ECC circuit 310 receives 64 data bits and 4 metadata bits, and generates 8 parity bits based on the 64+4 bits. The 64 data bits and 8 parity bits are then written to the data column planes 301 or 302 and the 4 metadata bits are written to the extra column plane 308. Since only the required bits can be written to (since only the selected transfer gates are activated by WrEn_MD) then an extra tCCD_L_WR latency penalty is not incurred.

The blocks in the first portion 301 and the second portion 302 represent the portions of those column planes which may be set aside for different storage and do not necessarily represent a physical arrangement of where information is stored in the portion of the column planes, or the spatial relationship of the column planes in each portion to each other. For example, the first portion may represent even column planes while the second portion represents odd column planes, and the columns set aside for storing ECC bits may be distributed throughout the data column planes. In the example of FIG. 3, since 8 bits of ECC are needed for every 64 bits of data, each portion 301 and 302 may have 87.5% of its total memory space used for data and 12.5% used for ECC and metadata bits. In other words, from the controllers perspective, only 87.5% of the memory array may be addressed, since the remaining portion is set aside for the metadata which is expected to come along with the data. In the two-pass x4 operational mode, more of the memory array may be available, since the metadata is stored in the data arrays, and there are 4 bits of metadata for every 64 bits of data. Accordingly, in the two-pass x4 operational mode, there may be 93.75% of the array set aside for data and 6.25% for metadata. When metadata is disabled, 100% of the array space may be used for data.

Table 1 is a summary of different operations in the two different x4 modes with metadata according to some embodiments of the present disclosure.

TABLE 1

Comparison of Example Two-Pass and One-Pass x4 Operational Modes

| | Two-Pass x4 | One-Pass x4 (Separate WrEN OFF) | One-Pass x4 (Separate WrEN ON) | Metadata Disabled |
|---|---|---|---|---|
| Prefetch | 8 p + 128 md/ 128d + 8p | 64d + 8(4)md + 8p | 64d + 4md + 8p | 128d + 8p |
| To/From Controller | 64d + 4md | 64d + 4md | 64d + 4md | 64d + 4md |
| Data CPs | Data + Metadata | Data + Parity | Data + Parity | Data |
| Extra CP | Parity | Metadata | Metadata | Parity |
| % Array Available for Data | 93.75% | 87.5% | 87.5% | 100% |
| ECC | SEC | SECDED | SECDED | SEC |
| MD ECC? | YES | YES (8 bits) | YES (4 bits) | NO |
| LATENCY | 2 x tCCD_ L WR | 1 x tCCD_ L_WR | <tCCD_ L_WR | 1 x (CCD_ L_WR |
| POWER | 17_CS + 17CS | 9 CS | 9 CS | 17 CS |

In Table 1, the notations d, p, and md are used to represent data bits, parity bits, and metadata bits respectively. For example, the first row uses the notation 8p+128md/128d+8p to represent that in the two-pass mode 8 metadata bits are fetched in a first pass (although only 4 metadata bits are used), and then 128 data bits and 8 parity bits are fetched in a second pass, while the notation 64d+8(4)md+8p is used to represent prefetching 64 data bits, 8 metadata bits and 8 parity bits as part of a single access pass (although only 4 metadata bits are used). In the one-pass mode when separate write enable is active, only the four needed metadata bits are accessed. The mode register may also have a setting which disables metadata. When no metadata is used, the device may act in a manner similar to the 'two-pass' mode, except that only a single pass is needed to prefetch the 128 data bits and 8 parity bits.

In the two-pass x4 operational mode (and in the metadata disabled mode), 128 metadata bits (four of which are associated with the data access) and 8 parity bits associated with those 128 metadata bits are used by the ECC circuit 232 in the first pass, while the 128 bits of data and 8 parity bits are used by the ECC circuit 232 in the second pass. In the one-pass x4 operational mode, 64 bits of data, 8 bits of metadata, and 8 bits of parity are used by the ECC circuit 232. When separate write enable is enabled, then 4 bits of metadata are used by the ECC circuit 232. In the two-pass x4 mode, the ECC circuit 232 may implement a SEC scheme separately on both the 128 metadata bits and the 128 data bits, while in the one-pass x4 modes, a SECDED scheme may be used, on both the data and metadata together. In other words, in the two-pass mode each set of parity may correspond to either data or metadata, while in the one-pass mode the parity corresponds to data and metadata together. Since a higher number of parity to other bits is used in the one-pass mode, more protection may be offered. In addition, in the one-pass mode the metadata may also be checked by the ECC circuit, while in the two-pass mode the metadata may be protected by the ECC circuit of the second pass.

In the two-pass x4 operational mode there may be an extra latency of 2×tCCD_L_WR since both access passes (of the metadata and the prefetched data) may need to undergo a RMW cycle. In the one pass x4 operational mode, only a single extra tCCD_L_WR is incurred. No extra tCCD_L_WR penalty is incurred when separate write enables are enabled. The metadata disabled mode may also only incur an extra tCCD_L_WR since the amount of prefetched data is greater than the amount to be written, so a RMW is used to prefetch the full set of data and then overwrite the selected bits.

The one-pass x4 operational mode may draw less power than the two-pass x4 operational mode (or the metadata disabled mode). In the one-pass mode, CS signals may only be provided to the selected half of the column planes (based on C10). Accordingly, only half of the column planes need to activate their switches, drive voltages along LIO lines, etc. This may reduce the power draw of a single access operation. For example, in the two-pass mode, 17 different CS signals (16 data column planes and 1 extra column plane) and their associated LIOs/GIOs etc are fired, while in the one-pass mode, 9 different CS signals and their associated LIOs/GIOs etc are fired. When separate write enable is enabled, the extra column plane only needs to fire half as many LIOs/GIOs. This is noted in table 1 as 8.5 CSs needing to fire, for a reduction in power compared to one-pass mode when separate write enable signals are disabled.

Figure 4:
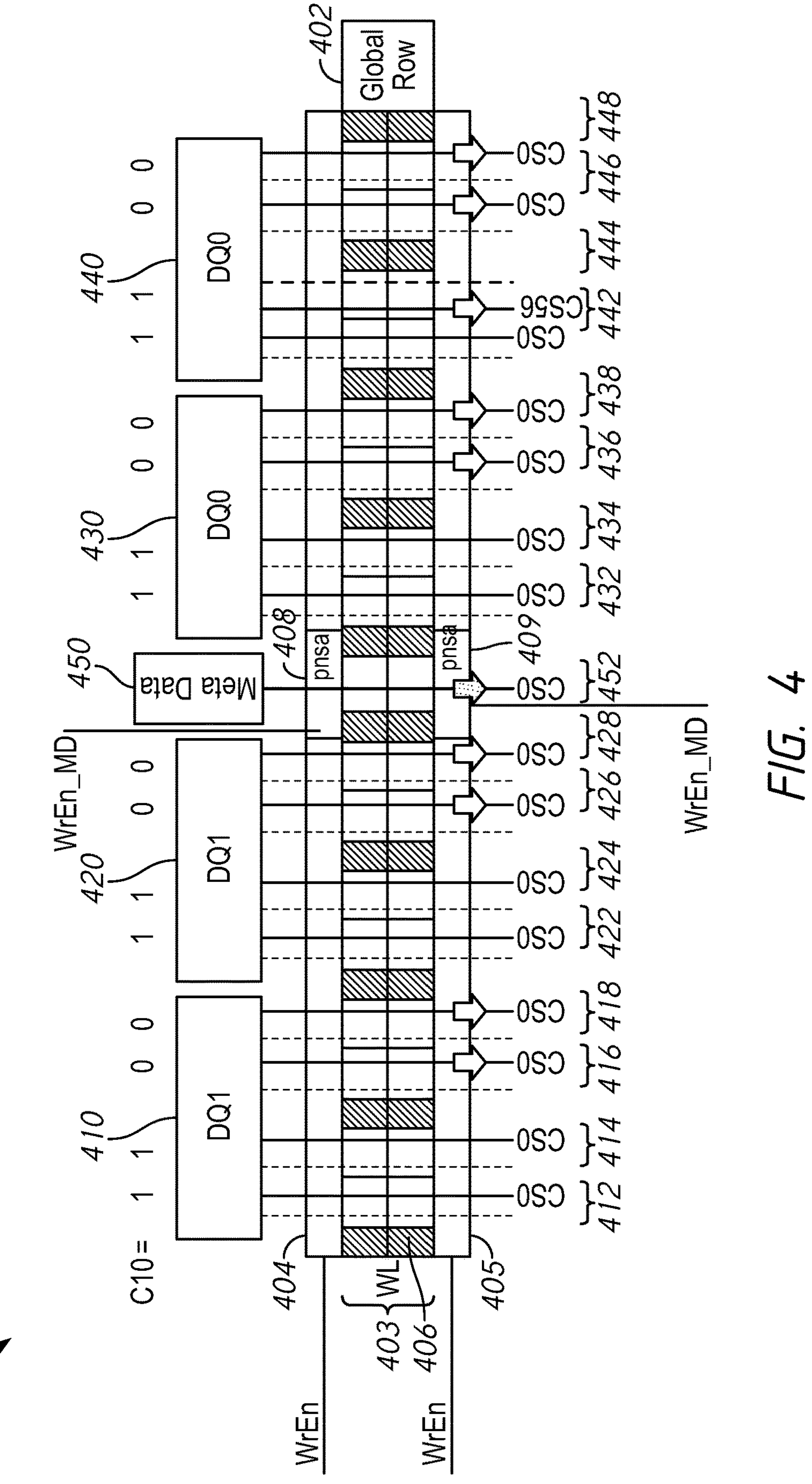
FIG. 4 is a schematic diagram of a portion of a memory bank according to some embodiments of the present disclosure.

FIG. 4 is a schematic diagram of a portion of a memory bank according to some embodiments of the present disclosure. The memory bank 400 may, in some embodiments, be included in the memory 100 of FIG. 1, 200 of FIG. 20, and/or 300 of FIG. 3. The memory bank 400 shows a simplified schematic view of a layout of memory bank along with example signals which may be used to activate various columns in the column planes as part of a second x4 operational mode (e.g., a one-pass x4 operational mode) when the separate write enable signals are active.

Similar to FIG. 3, FIG. 4 is described with respect to an example embodiment where there are 16 data column planes, each of which includes 64 sets of bit lines (e.g., 64 values of the CS signal) each of which provides 8 bits of data when activated by the respective CS signal. It should be understood that this is one example implementation of the present disclosure, and that other arrangements may be used in other example embodiments (e.g., more or fewer CS sets per CP, more or fewer CP's per memory bank, etc.).

The memory bank 400 shows a memory organized into sixteen column planes 412-448 (e.g., 210 of FIGS. 2 and/or 301-302 of FIG. 3), each of which is associated with a DQ pad 410-440. So a first DQ pad 410 is associated with column planes 412-418, a second DQ pad 420 is associated with column planes 422-428, a third DQ pad 430 is associated with column planes 432-438, and a fourth DQ pad is associated with column planes 442-448. In the example x4 mode of FIG. 4, each of the four DQ pads 410, 420, 430 and 440 handles 16 data bits as part of an access operation, for a total of 64 data bits. In addition to the four DQ pads 410, 420, 430, and 440, the memory bank 400 may also be associated with a metadata terminal 450, which may be used to send/received metadata as part of an access operation. The metadata terminal is associated with an extra column plane 452 (e.g., 212 of FIGS. 1 and/or 308 of FIG. 3). In the simplified view of FIG. 4, a single word line WL is shown, along with a global row decoder 402 which drives the word line. Similarly, only selected lines are shown for the bit lines, each of which represents a set of bit lines activated by a common CS signal in that CP.

The memory bank 400 is organized in sections or mats 403 with the cells of the memory array between two sense amplifier regions 404. There may be a number of sections each with a number of word lines and bit lines in each column plane, however for the sake of clarity only a single section 403 is shown in FIG. 4. The sense amplifier regions 404 may be elongated in a same direction as the word line WL. The different sections may extend in a direction perpendicular to the direction the word line is elongated in. Each section may be separated by sense amplifier regions (e.g., 404-409). The sense amplifiers in each of the region may be coupled to a bit line in the section and a bit line in the adjacent section. During an access operation, the bit line in the section that includes the active word line may be accessed while the bit line which extends into the non-accessed section may act as a reference. During a write operation, the sense amplifier sections 404 and 405 may be activate (e.g., be coupled to the GIOs) responsive to a write enable signal WrEn.

The extra column plane 452 is also surrounded by a first and second sense amplifier section 408 and 409, which may be generally similar to the sense amplifier regions 404 and 405 respectively. The first sense amplifier region 408 is activated by a first state of a column signal(CA10) and the second sense amplifier region 409 is activated by a second state of a column signal (CA10).

The column planes 412-448 in the section 403 are separated by sub word line (SWL) drivers 406. Each column plane is adjacent to one other column plane and to a SWL driver 406. For example, the column plane 412 is adjacent to a SWL driver 406 on one side and to the column plane 414 on the other side. The column plane 414 is adjacent to the column plane 412 on a first side and to a second SWL driver 406 on the opposite side. On the opposite side of that SWL driver 406 is another column plane 416 and so forth.

Accordingly, each data terminal is associated with four column planes, two pairs of column planes which are adjacent to each other, and which are separated from the other pair by a SWL driver. Each pair is associated with a different value of the column plane selection bit C10. For example, the first DQ pad 410 is associated with column planes 412 and 414, both of which are activated by C10 at a high logical level, and with column planes 416 and 418, both of which are activated by C10 at a low logical level. Accordingly, the column planes 412, 414, 422, 424, 432, 434, 442, and 444 all contain data which is accessed when C10=1 and the column planes 416, 418, 426, 428, 436, 438, 446, and 448 all contain data which is accessed when C10=0. Whichever set of column planes is selected by C10, one or more column planes of the other set may be used to store the ECC parity bits.

FIG. 4 shows an example access operation in a second x4 operating mode (e.g., a one-pass x4 mode) when the separate write enable mode is active. The section 403 is bordered on either side by a first sense amplifier region 404 and a second sense amplifier region. Each sense amplifier region receives a column select signal as well as a write enable signal WrEn. The sense amplifiers of each region 404 and 405 are alternately coupled to every other bit line in the section 403. For example, the sense amplifier region 404 may be an even sense amplifier region and the sense amplifier region 405 may be an odd sense amplifier region.

In the example write operation, the memory device receives a column address which includes C10=0 and which has a value that decoders to the first column select signal CS0. Accordingly, CS0 is provided by the column decoder to the column planes 416, 418, 426, 428, 436, 438, 446, and 448 along with the write enable signal WrEn, and the bit lines associated with CS0 in each of those column planes each provide 8 bits of data, four bits for each column plane from each of the sense amplifier regions 404 and 406. The column decoder also provides CS0 to the extra column plane 452, along with one state of WrEn_MD (selected by C10). Accordingly 4 bits of metadata are accessed from the extra column plane 452 (e.g., from the sense amplifier 408). In addition, the column decoder also generates an additional CS signal and provides it to one of the column planes which was not selected by the value of C10. In this example embodiment, a value CS56 is provided to the column plane 444. Accordingly, the column plane 444 provides 8 bits of ECC parity. In this manner, from a single access pass, 64 bits of data (8 each from column planes 416, 418, 426, 428, 436, 438, 446, and 448), 4 bits of metadata (half of what was retrieved from extra column plane 452) and 8 bits of parity (from column plane 444) are accessed. The arrows are used to show which CS signals and which column planes are accessed as part of a single access pass.

While not shown in FIG. 4, a similar access may happen as part of a second access operation where a column address is received which includes C10=1, but the same decoded value of CS. In that example, the column decoder provides CS0 to the column planes 412, 414, 422, 424, 432, 434, 442, and 444, and to the extra column plane 452, while a CS56 value is provided to the column plane 448. In this operation the other value of WrEn_MD is provided, and the other four bits are accessed (e.g., from the sense amplifiers 409 instead of 408).

Figure 5:
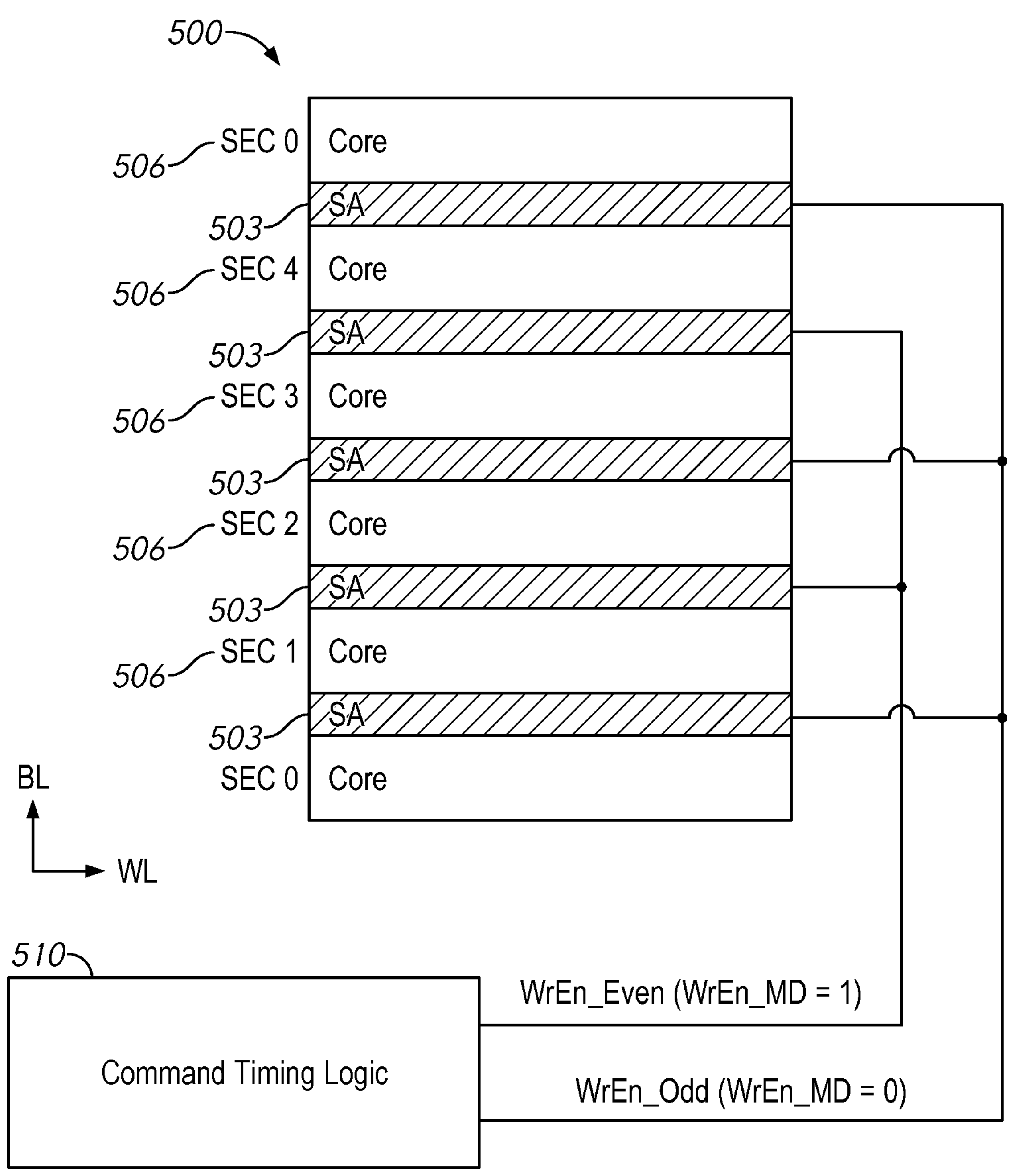
FIG. 5 is a block diagram of an extra column plane according to some embodiments of the present disclosure.

FIG. 5 is a block diagram of an extra column plane according to some embodiments of the present disclosure. The extra column plane 500 may, in some embodiments represent the extra column plane 212 of FIG. 2, 308 of FIG. 3, and/or 452 of FIG. 4. The extra column plane 500 is shown along with a command decoder 510 (e.g., 106 of FIG. 1) which provides various signals. The view of FIG. 5 shows how the write enable are provided to different sense amplifier regions 502 and 503 in the extra column plane 500.

The extra sense amplifier region 500 includes a number of sections 506 (e.g., 403 of FIG. 4) each of which include a number of memory cells at the intersection of word lines and bit lines. The sections 506 are each bordered by a pair of sense amplifier regions 502 and 503 (e.g., 408 and 409 of FIG. 4). In turn, each sense amplifier region 502 and 503 borders two section 506 (except at the edges of the array).

An even write enable signal WrEn_Even activates sense amplifiers in the regions 502 as pait of a write operation, while an odd write enable signal WrEn_Odd activates sense amplifiers 503 as part of a write operation. In some embodiments, the command decoder 510 may provide a single binary signal WrEn_MD which may be in a first state to activate WrEn_Even and in a second state to activate WrEn_Odd. For example, if WrEn_MD high activates WrEn_Even then WrEn_MD low may activate WrEn_Odd (or vice versa).

Figure 6:
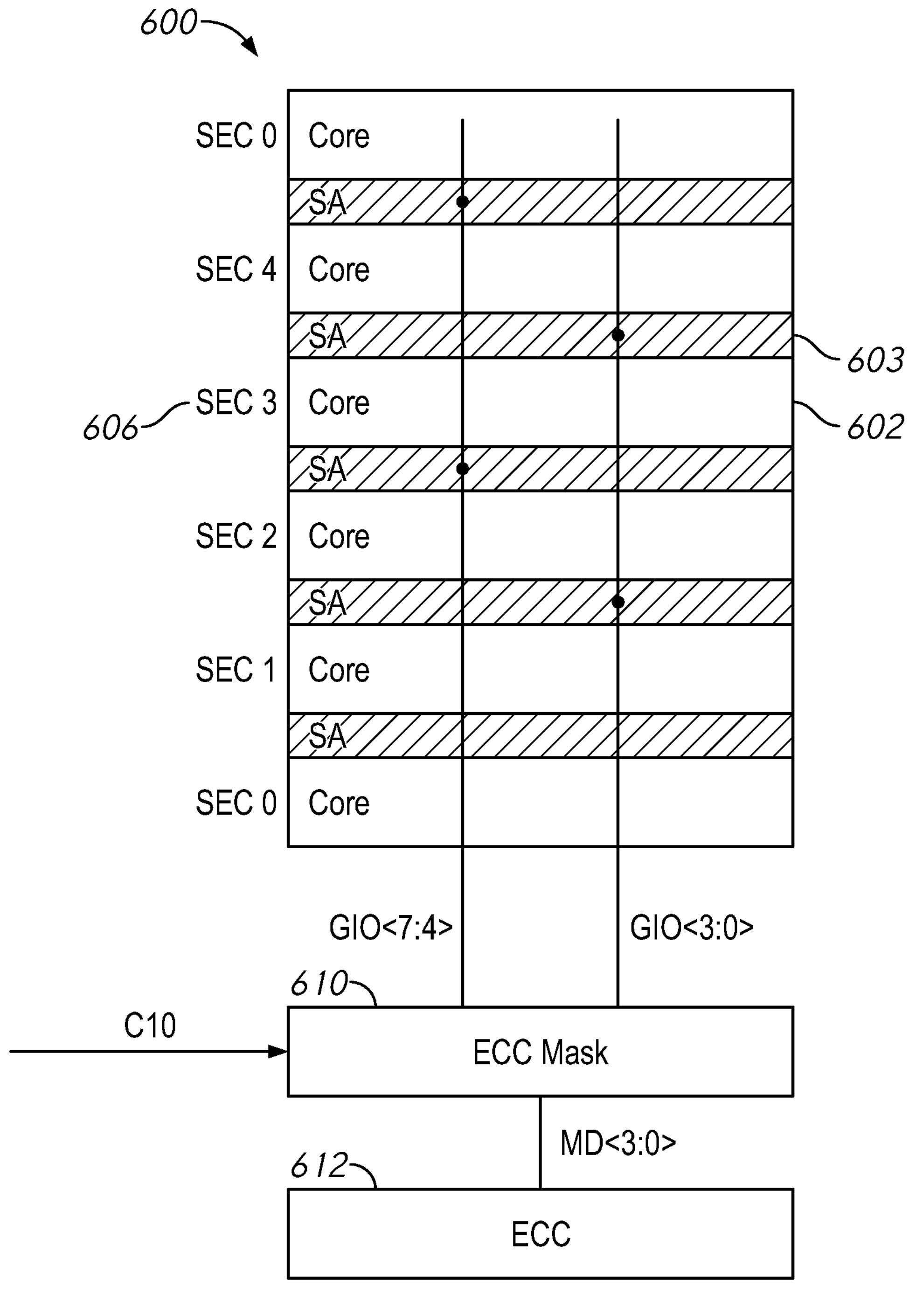
FIG. 6 is a block diagram of an extra column according to some embodiments of the present disclosure.

FIG. 6 is a block diagram of an extra column according to some embodiments of the present disclosure. The extra column plane 600 may, in some embodiments, represent the extra column plane 212 of FIG. 2, 308 of FIG. 3, 452 of FIGS. 4, and/or 500 of FIG. 5. In particular, the extra column plane 500 may represent the extra column plane 500, but in FIG. 6 circuits and signals relevant to a read operation are shown (instead of the write signals shown in FIG. 5).

In FIG. 6 a read operation has been performed on one of the sections of the extra column plane 600, and data is being read out along the GIOs. For example, a section 606 may be accessed based on the row address, and the column select signals may be provided to the sense amplifiers in the bordering sense amplifier regions 602 and 603. Those sense amplifiers may read out the data, and couple the read data to respective GIOs. Since 8 bit lines are accessed, there may be a set of 8 GIOs. In the example of FIG. 6. GIO<3:0> are coupled to the even sense amplifiers 602 and GIO<7:4> are coupled to the odd sense amplifiers 603.

During the read operation, 8 metadata bits are accessed including four selected bits and four non-selected bits (as opposed to a write operation where only the four accessed metadata bits are accessed due to the separate WrEn signals). However, the parity bits are generated by the ECC circuit 612 during the write operation, and accordingly, the parity bits are only based on the selected four metadata bits. To account for this, the memory may include an ECC mask circuit 610, which receives the GIO lines from the extra column plane 600 and provides either one set or the other to the ECC circuit 612 during a read operation. Which set of GIO lines is provided to the ECC circuit 612 may be based on a state of the column plane select bit in the column address (e.g., C10).

For example, if the C10 indicates the even sense amplifiers, then the ECC mask circuit 610 may provide the GIO<3:0> as the metadata bits MD<3:0> to the ECC circuit 612. If the C10 indicates the odd sense amplifiers, then the ECC mask circuit 610 may provide the GIO<7:4> as the metadata bits MD<3:0> to the ECC circuit 612. In this manner, only the selected bits are passed to the ECC circuit 612 during a read operation.

Figure 7:
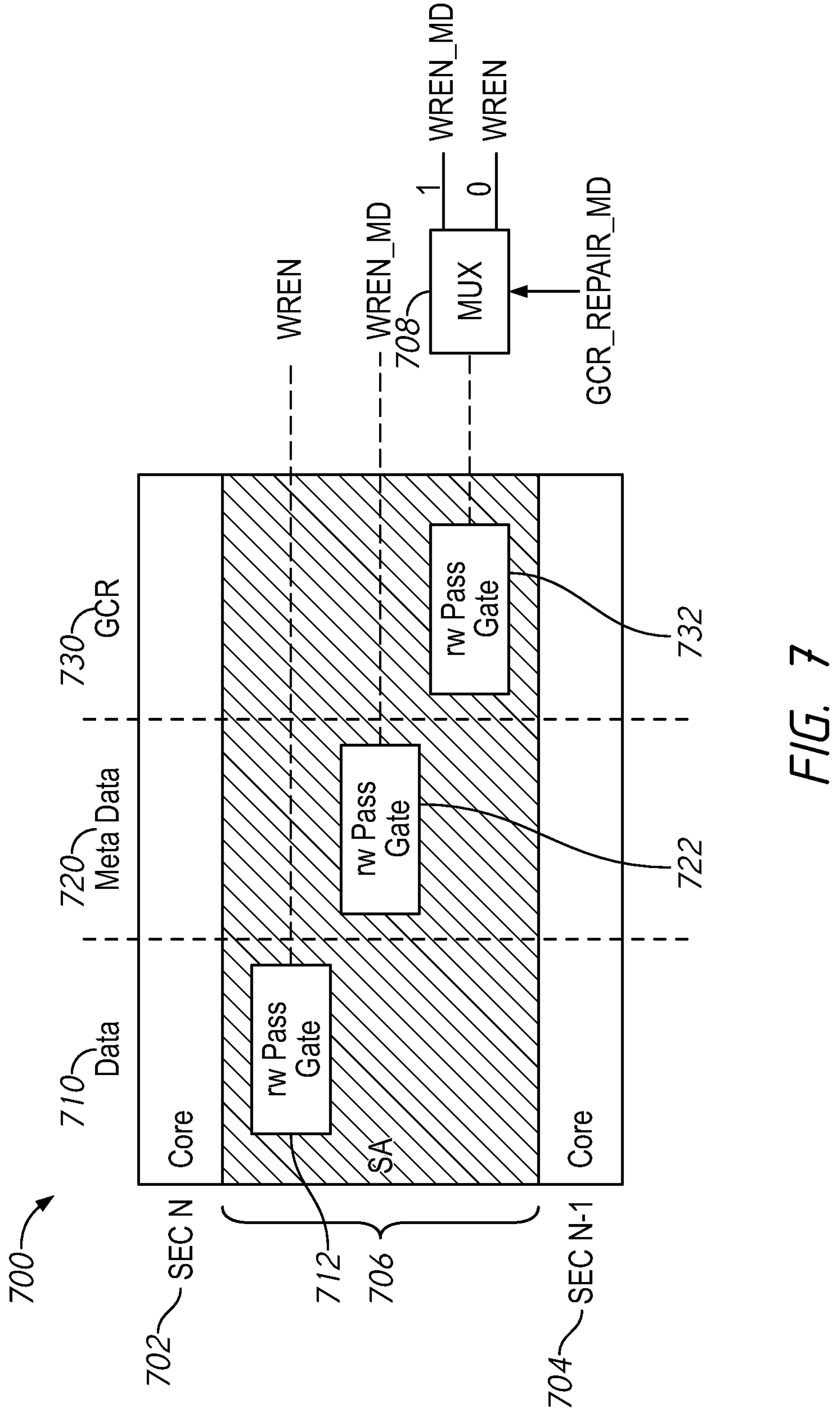
FIG. 7 is a block diagram of a sense amplifier region according to some embodiments of the present disclosure.

FIG. 7 is a block diagram of a sense amplifier region according to some embodiments of the present disclosure. The sense amplifier region 700 may, in some embodiments, represent the sense amplifier region 404 and 408 (or 405 and 409) of FIG. 4, or a set of sense amplifiers which include the sense amplifier region 502 or 503 of FIG. 5. FIG. 7 shows a simplified view where several components, signal lines, etc have been omitted. Similarly. FIG. 7 shows a single data portion 710, along with an extra portion 720 and GCR portion 730, all aligned next to each other however there may be multiple data portions (e.g., 16) and any spatial arrangement of such portions (e.g., 8 data portions, the extra portion, 8 more data portions, etc.).

The sense amplifier region 700 includes a stripe of sense amplifiers 706 as well as portions of the bordering sections 702 and 704. The stripe of sense amplifiers 706 includes a number of individual sense amplifiers (not shown in FIG. 7 for clarity) each of which is coupled to a bit line in both the sections 702 and 704 (whichever one is accessed the other will act as a reference). The sense amplifiers are coupled to every other bit line in the sections 702 and 704, the others of which are coupled to sense amplifiers in other stripes (not shown).

The sense amplifier region 700 includes three portions 710, 720 and 730. The first portion 710 is associated with a data column plane (e.g., 210 of FIG. 2). The second portion 720 is associated with an extra column plane (e.g., 212 of FIG. 2). The third portion 730 is associated with a GCR column plane (e.g., 214 of FIG. 2). In each section a respective read/write pass gate 712, 722, and 732 is shown. Each section may have a number of read/write pass gates (e.g., one for each LIO/GIO in that section), however for clarity only one read/write pass gate per section is shown.

During an example read operation data may be read out along bit lines and amplified by the sense amplifiers and a column select signal determines which bit lines are coupled to their respective LIOs. The read/write pass gates 712, 722, and 732 may receive a read enable signal (not shown) which couples the data on the LIO to the GIO, so that it can be read out along the GIO to the ECC (e.g., 120 of FIG. 1) and data terminals DQ.

During an example write operation, data and metadata is received and the ECC generates parity based on the data and metadata. The data, parity, and metadata is provided along GIO lines and the read/write pass gates 712, 722, and 732 may receive respective write enable signals (WrEn or WrEn_MD). If the write enable signal is active, the data along the GIO is coupled to the LIO, which causes the sense amplifier to change the voltage of the bit line selected by CS, which in turn changes the signal stored in the memory cell at the intersection of that bit line and the active word line.

The read/write pass gates 712 in the data portion 710 receive a signal WrEn. The signal WrEn may be a binary signal which is active in a first state (e.g., a logical high) and inactive in a second state (e.g., a logical low). The read/write pass gates 722 in the extra portion 720 receive a signal WrEn_MD. When WrEn_MD is in a first state, the read/write pass gate 722 may be active if it is an even read write pass gate, and when WrEn_MD is in a second state, the read/write pass gate 722 may be active if it is an odd pass gate.

A logic circuit 708 (e.g., one of the logic circuits 240 of FIG. 2) provides either WrEn or WrEn_MD to the read/write pass gate 732 in the GCR portion 730. For example, the logic circuit 708 may be a multiplexer which provides either WrEn or WrEn_MD to the read/write pass gate 732. The multiplexer select which of the write enable signals to provide based on a repair signal GCR_REPAIR_MD. The repair signal may be specific to each logic circuit 708 and each read/write pass gate 732 in the GCR portion 730, and may indicate if that pass gate 732 is part of a repair operation on columns from the data portion 710 or the extra portion 720. If the repair signal indicates the repair is from the extra portion 720, then WrEn_MD is passed and the read/write pass gate may mimic the behavior of the read/write pass gate 722. If the repair signal indicates the repair is from the data portion 710, then the signal WrEn is passed and the read/write gate 732 may mimic the behavior of the read/write pass gate 712. The repair signal may be generated based on the repair information stored in the fuse array (e.g., 152 of FIG. 1).

Figure 8:
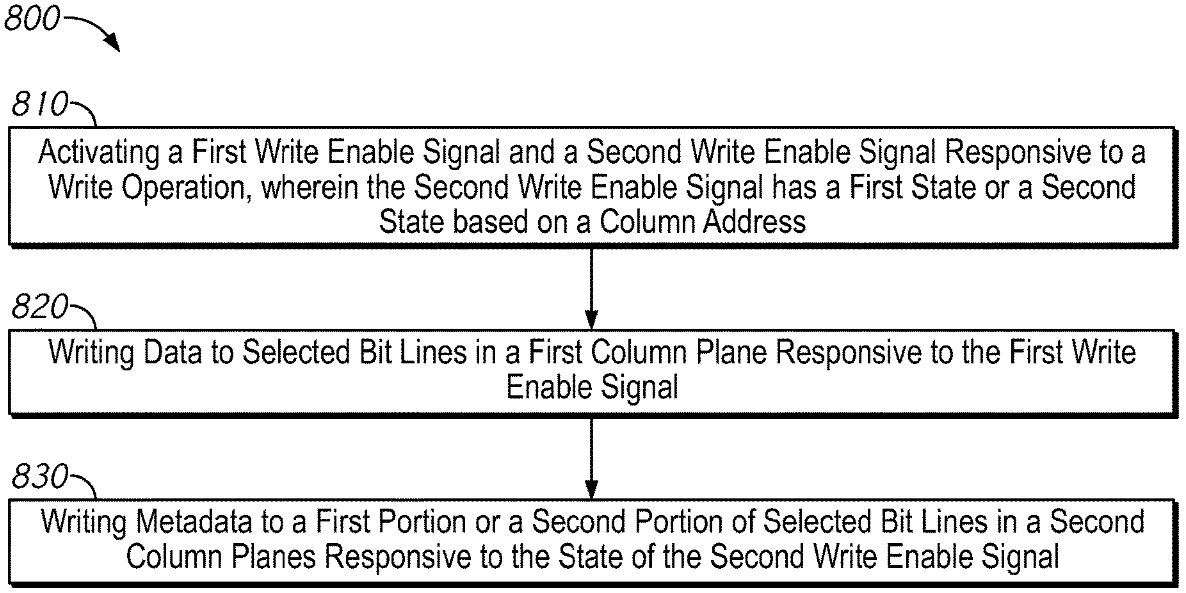
FIG. 8 is a flow chart of a method according to some embodiments of the present disclosure.

FIG. 8 is a flow chart of a method according to some embodiments of the present disclosure. The method 800 may, in some embodiments, be implemented by one or more of the apparatuses or systems disclosed herein. For example, the method 800 may be implemented by one or more of the systems or components of FIGS. 1-7.

The method 800 includes box 810, which describes activating a first write enable signal and a second write enable signal responsive to a write operation, wherein the second write enable signal has a first state or a second state based on a column address. For example the first write signal may be WrEn, while the second may be WrEn_MD. The method 800 may include determining the state of the second write enable signal based on a column plane select bit of the column address (e.g., C10).

Box 810 may be followed by box 820, which describes writing data to selected bit lines in a first column plane responsive to the first write enable signal. For example, the method 800 may include receiving data and providing the data along GIO lines and coupling the GIO lines to LIO lines associated with the first column plane with a transfer gate (e.g., 712 of FIG. 7) responsive to the first write enable signal.

Box 830 represents steps which may happen more or less simultaneously with the steps of box 820. Box 830 describes writing metadata to a first portion or a second portion of selected bit lines in a second column planes responsive to the state of the second write enable signal. For example, the metadata may be provided along GIO lines and which are selectively coupled to LIO lines by transfer gates (e.g., 722 of FIG. 7). The LIO lines are coupled to the selected bit lines in the second column plane (e.g., an extra column plane such as 212 of FIG. 2). A first or second portion of the transfer gates may be activated by the second write enable signal (e.g., WrEn_MD) based on its value. For example, if the second write enable signal is in a first state, then even ones of the transfer gates may be activated, and thus metadata written to even of the selected bit lines. If the second write enable signal is in the second state, then odd ones of the transfer gates may be activated, and thus metadata written to odd of the selected bit lines.

The method 800 may include generating a column select signal based on the column address and selecting the bit lines in the first and the second column plane based on a value of the column select signal. The method 800 may include selecting a first portion (e.g., 301 of FIG. 1) or a second portion (e.g., 302) of a plurality of column planes based on a column plane select bit (e.g., C10). The first column plane is in the first portion or the second portion, while the second column plane is in neither the first nor the second portion (e.g., it is an extra column plane). The method 800 may include generating parity bits based on the received data and the metadata bits and writing the parity bits to selected bit lines in a third column plane. The third column plane may be a column plane which is not selected by the column plane select bit.

The method 800 may include reading a first set of bits from the first portion and reading a second set of bits from the second portion of the selected bit lines in the second column plane as part of a read operation and selecting the first set of bits or the second set of bits (e.g., with an ECC reading mask circuit such as 610 of FIG. 6). The selecting may be based on the column plane select bit (e.g., C10). The method 800 may include providing the selected one of the first set of bits or the second set of bits to an ECC circuit (e.g., 612 of FIG. 6).

The method 800 may include repairing the selected bit lines in the first column plane or the selected bit lines in the second column plane to selected bit lines in a global column repair (GCR) column plane. For example, the method 800 may include programming an address associated with the repaired bit lines in a fuse array (e.g., 152 of FIG. 1). The method 800 may include writing the data to the selected bit lines in the GCR column plane responsive to the first write enable signal if the selected bit lines in the first column plane were repaired or writing the metadata to a first portion or a second portion of the selected bit lines in the GCR column plane responsive to the state of the second write enable signal if the selected bit lines in the second column plane were repaired. For example, logic (e.g., 240 of FIG. 2) may pass the first write enable signal or the second write enable signal to a pass gate associated with the bit lines in the GCR column plane based on which bit lines were repaired.

Figure 9:
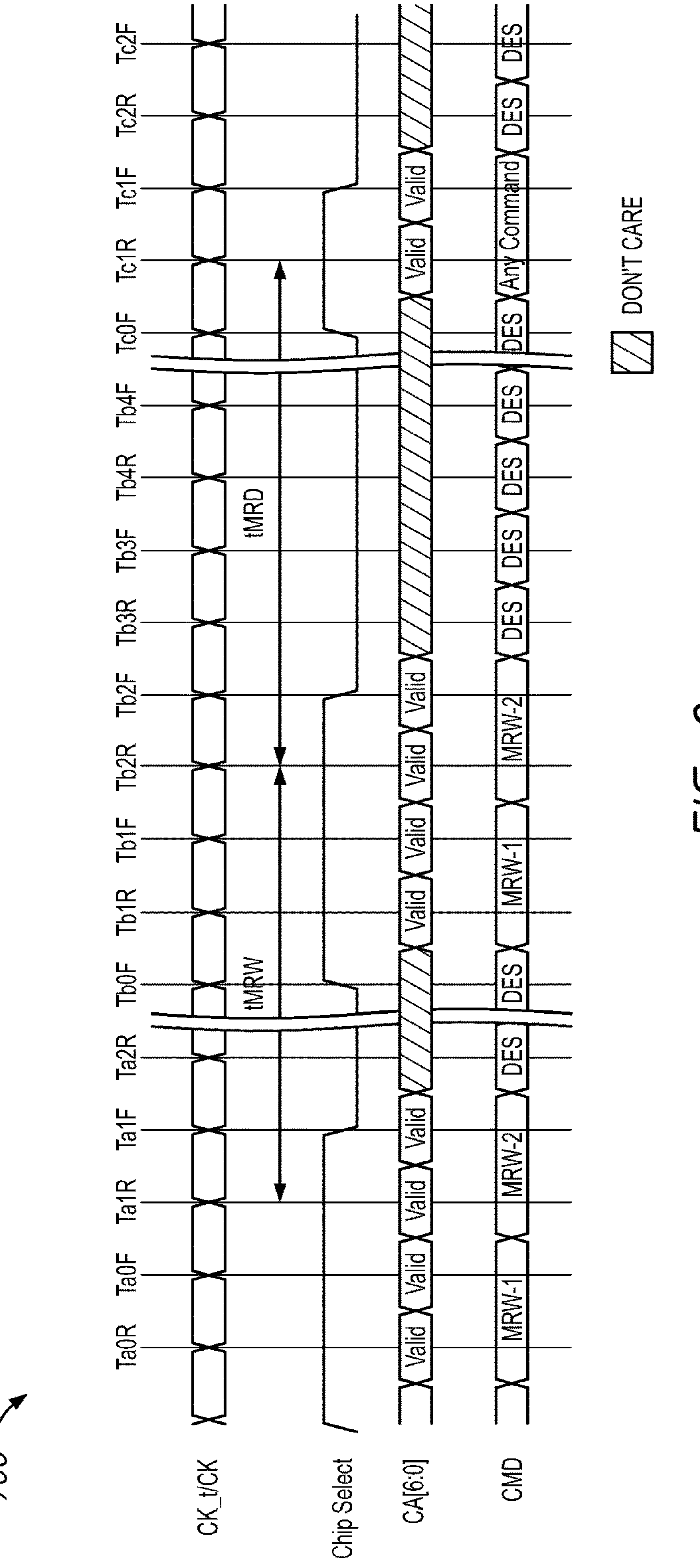
FIG. 9 is a timing diagram of a mode register write operation according to some embodiments of the present disclosure.

FIG. 9 is a timing diagram of a mode register write operation according to some embodiments of the present disclosure. The timing diagram 900 may represent an example of how a controller (e.g., 150 of FIG. 1) may write a value to a mode register (e.g., 130 of FIG. 1) to set a mode of the memory.

The timing diagram 900 shows a clock signal CK_t/CK_c (e.g., CK and/CK of FIG. 1) along with a chip select signal. The chip select signal is used to indicate that the controller is addressing this particular memory device (e.g., chip). In FIG. 6 a higher level is used to represent the chip select signal being active, but in some embodiments, the chip select signal may be active low. Also shown are signals along a command/address bus CA and commands CMD.

The timing diagram 900 shows three MRW operations happening in sequence, at time points Ta0R, Tb1R, and Tc1R. Each MRW operation includes providing an address within the mode register along with data to be written to that register along CA (shown in the boxes marked "Valid" to indicate that value MR address and data is being provided). Two sequential MRW commands, marked MRW-1 and MRW-2 are used to indicate that the information along the CA bus is part of a MRW operation.

Figure 10:
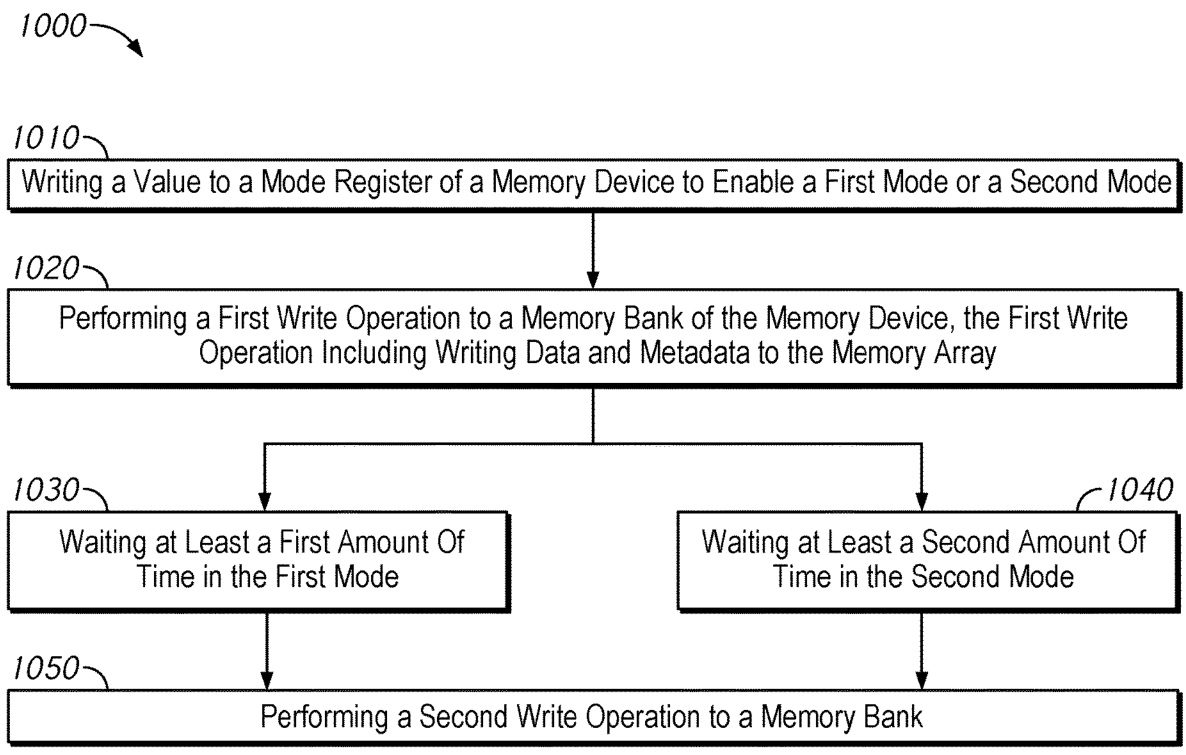
FIG. 10 is a flow chart of a method according to some embodiments of the present disclosure.

FIG. 10 is a flow chart of a method according to some embodiments of the present disclosure. The method 1000 may, in some embodiments be implemented by one or more of the devices or systems described herein. For example, the method 1000 may be implemented by controller 150 of FIG. 1.

The method 1000 includes block 1010, which describes writing a value to a mode register of a device to enable a first mode or a second mode. For example, the controller may perform a MRW operation, such as the example MRW of FIG. 9. The first mode may be a one-pass x4 operational mode where separate write enable signals are disabled and the second mode may be a one-pass x4 operational mode where separate write enable signals are enabled.

Block 1010 may be followed by block 1020, which describes performing a first write operation to a memory bank of the memory device. The first write operation includes writing data and metadata to the device. For example, the controller may provide a write command along with a row, column and bank address to C/A terminals. The controller may provide data bits and metadata bits to DQ terminals. For example, the controller may provide 64 data bits and 4 metadata bits. The controller may also generate a column address and provide it as part of the access operation. The column address may be generated to address addressable portions of the memory array. For example, the column address may be generated based on a CS value that it is desired to address, and in both the first and second mode the column address may be associated with a range of CS values (e.g., CS0 to CS55) which is smaller than the range of all possible CS values (e.g., CS0 to CS63).

Block 1020 may be followed by either block 1030 or block 1040 depending on whether the memory device is in the first mode or the second mode. Block 1030 describes waiting at least a first amount of time after the write operation when the device is in the first mode. Block 1040 describes waiting at least a second amount of time after the write operation when the device is in the second mode. The first amount of time may be at least tCCD_L_WR. The second amount of time may be less than tCCD_L_WR. In some embodiments, the method 1000 may include waiting the first or the second amount of time before accessing a different bank which is in the same bank group.

Blocks 1030 and 1040 may be followed by block 1050, which describes performing a second write operation to the memory bank. The second write operation may be generally similar to the first write operation described with respect to block 1020. In the first mode the controller may wait at least the first amount of time between the first and the second write operations and in the second mode the controller may wait at least the second amount of time between the first and the second write operations.

The method 1000 may include reading the data and the metadata from the memory array as part of a read operation. Since both of the modes may allow the memory to operate with a SECDED ECC scheme, the method 1000 may include receiving a signal from the memory which indicates that a double bit error was detected (but not corrected) in the data and the metadata. The first or the second write operation may include, when the device is in the first mode, reading metadata from an extra column plane by activating a column select signal, modifying some of the read metadata with new written metadata, and writing back the modified metadata. The first or the second write operation may include, when the device is in the second mode, activating a write enable signal associated with some (but not all) of the column lines associated with the column select signal and only writing the metadata to the column lines selected by the write enable signal.

In some embodiments, the controller may write a value to the mode register to set the memory into a third mode (e.g., a two-pass mode)

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims

What is claimed is:

1. An apparatus comprising:

a first column plane comprising a first plurality of bit lines;

a second column plane comprising a second plurality of bit lines, the second plurality of bit lines including a plurality of even numbered bit lines and a plurality of odd numbered bit lines, wherein bit lines of the plurality of even numbered bit lines alternate with bit lines of the plurality of odd numbered bit lines;

an input/output circuit configured to receive data and metadata as part of a write operation, wherein the data is written to the first plurality of bit lines and wherein the metadata is written to the bit lines of the plurality of even numbered bit lines or to the bit lines of the plurality of odd numbered bit lines.

2. The apparatus of claim 1, further comprising a column decoder configured to provide a column select signal based on the column address, wherein the first plurality of bit lines and the second plurality of bit lines are activated by a same value of the column select signal.

3. The apparatus of claim 1, further comprising a column decoder configured to provide a first write enable signal and a second write enable signal, wherein the data is written to the first plurality of bit lines responsive to the first write enable signal, and wherein the bit lines of the plurality of even numbered bit lines or the bit lines of the plurality of odd numbered bit lines are selected based on a value of the second write enable signal, and wherein the metadata is written to the selected one of the bit lines of the plurality of even numbered bit lines or the bit lines of the plurality of odd numbered bit lines.

4. The apparatus of claim 1, further comprising:

a global column repair (GCR) column plane comprising a plurality of redundant bit lines;

a fuse array configured to remap the first plurality of bit lines or the second plurality of bit lines to the plurality of redundant bit lines, wherein if the first plurality of bit lines is remapped to the plurality of redundant bit lines then the data is written to the plurality of redundant bit lines and wherein if the second plurality of bit lines is remapped to the plurality of redundant bit lines the metadata is written to bit lines of a plurality of even numbered bit lines or bit lines of a plurality of odd numbered bit lines included in the plurality of redundant bit lines.

5. The apparatus of claim 4, further comprising a logic circuit configured to provide a first write enable signal if the first plurality of bit lines is remapped to the plurality of redundant bit lines and to provide a second write enable signal if the second plurality of bit lines is remapped to the plurality of redundant bit lines.

6. The apparatus of claim 1, further comprising:

a third column plane comprising a third plurality of bit lines;

an error correction code (ECC) circuit configured to receive the data and the metadata and generate parity bits based on the metadata as part of the write operation, wherein the parity bits are written to the third plurality of bit lines.

7. The apparatus of claim 6, further comprising an ECC mask circuit configured to receive a set of bits including the metadata from the second plurality of bit lines as part of a read operation, and configured to provide even or odd ones of the set of bits to the ECC circuit.

8. A method comprising:

activating a first write enable signal and a second write enable signal responsive to a write operation, wherein the second write enable signal has a first state or a second state based on a column address;

writing data to selected bit lines in a first column plane responsive to the first write enable signal; and writing metadata to a first portion or a second portion of selected bit lines in a second column plane responsive to the state of the second write enable signal.

9. The method of claim 8 wherein the first portion is comprises bit lines of a plurality of even numbered bit lines of the selected bit lines and the second portion is comprises bit lines of a plurality of odd numbered bit lines of the selected bit lines.

10. The method of claim 8, further comprising:

generating a column select signal with a value based on the column address; and selecting the selected bit lines in the first column plane and the selected bit lines in the second column plane based on the value of the column select signal.

11. The method of claim 8, further comprising:

generating parity bits based on the data and the metadata; and writing the parity bits to selected bit lines in a third column plane.

12. The method of claim 8, further comprising selecting a first portion or a second portion of a plurality of column planes based on a column plane select bit of the column address, wherein the first column plane is in the first portion or the second portion and wherein the second column plane is not in the first portion or the second portion.

13. The method of claim 8, further comprising:

reading a first set of bits from the first portion and reading a second set of bits from the second portion of the selected bit lines in the second column plane as part of a read operation;

selecting the first set of bits or the second set of bits; and providing the selected one of the first set of bits or the second set of bits to an error correction code (ECC) circuit.

14. The method of claim 8, further comprising:

repairing the selected bit lines in the first column plane or the selected bit lines in the second column plane to selected bit lines in a global column repair (GCR) column plane;

writing the data to the selected bit lines in the GCR column plane responsive to the first write enable signal if the selected bit lines in the first column plane were repaired;

writing the metadata to a first portion or a second portion of the selected bit lines in the GCR column plane responsive to the state of the second write enable signal if the selected bit lines in the second column plane were repaired.

15. An apparatus comprising:

a first column plane comprising:

a first local input/output (LIO) line coupled to a first read/write transfer gate;

a second LIO line coupled to a second read/write transfer gate;

a second column plane comprising:

a third LIO line coupled to a third read/write transfer gate;

a fourth LIO line coupled to a fourth read/write transfer gate; and a column decoder configured to provide a first write enable signal to the first column plane and a second write enable signal to the second column plane, wherein the first and the second read/write transfer gate are activated by the first write enable signal and the third or the fourth read/write transfer gate are activated by the second write enable signal.

16. The apparatus of claim 15, wherein the first column plane further comprises:

a first plurality of bit lines, a selected one of which is coupled to the first LIO line; and a second plurality of bit lines, a selected one of which is coupled to the second LIO line, and wherein the second column plane further comprises:

a third plurality of bit lines, a selected one of which is coupled to the third LIO line; and a fourth plurality of bit lines, a selected one of which is coupled to the fourth LIO line.

17. The apparatus of claim 16, wherein the selected one of the first, the second, the third, and the fourth plurality of bit lines is selected by a same value of a column select signal.

18. The apparatus of claim 15, further comprising:

an error correction code (ECC) circuit; and an ECC mask circuit configured to receive a first bit from the third read/write transfer gate and a second bit from the fourth read/write transfer gate and provide the first bit or the second bit to the ECC circuit.

19. The apparatus of claim 15 further comprising:

a third column plane comprising:

a fifth LIO line coupled to a fifth read/write transfer gate; and a logic circuit configured to provide the first write enable signal or the second write enable signal to the fifth read/write transfer gate.

20. The apparatus of claim 19, wherein if the first or the second LIO line is repaired to the fifth LIO line, the logic circuit is configured to provide the first write enable signal, and wherein if the third or the fourth LIO line is repaired to the fifth LIO line, the logic circuit is configured to provide the second write enable signal.

* * * * *